United States Patent
Kimura

[11] Patent Number: 5,883,539
[45] Date of Patent: Mar. 16, 1999

[54] DIFFERENTIAL CIRCUIT AND MULTIPLIER

[75] Inventor: Katsuji Kimura, Tokyo, Japan

[73] Assignee: NEC Corporation, Tokyo, Japan

[21] Appl. No.: 761,836

[22] Filed: Dec. 9, 1996

[30] Foreign Application Priority Data

Dec. 8, 1995 [JP] Japan .................................. 7-345866
Sep. 13, 1996 [JP] Japan .................................. 8-265504

[51] Int. Cl.$^6$ .............................. G06G 7/163; H03F 3/45
[52] U.S. Cl. ........................... 327/359; 327/65; 327/120; 327/563; 330/254; 330/261
[58] Field of Search .................. 330/252, 261, 330/254, 259; 327/355, 356, 357, 359, 52, 63, 65, 119, 120, 563

[56] References Cited

U.S. PATENT DOCUMENTS

| | | | |
|---|---|---|---|
| 3,681,702 | 8/1972 | Dann | 327/26 |
| 4,663,594 | 5/1987 | Perkins | 327/240 |
| 4,951,003 | 8/1990 | De Jager et al. | 330/252 |
| 5,317,279 | 5/1994 | Zarabadi et al. | 330/257 |
| 5,381,113 | 1/1995 | Kimura | 330/261 |
| 5,396,125 | 3/1995 | Wong | 327/202 |
| 5,471,166 | 11/1995 | Kimura | 327/351 |
| 5,481,224 | 1/1996 | Kimura | 330/253 |
| 5,485,119 | 1/1996 | Kimura | 330/253 |
| 5,489,868 | 2/1996 | Gilbert | 327/65 |
| 5,500,623 | 3/1996 | Kimura | 330/252 |
| 5,506,537 | 4/1996 | Kimura | 327/351 |
| 5,512,855 | 4/1996 | Kimura | 327/538 |
| 5,521,542 | 5/1996 | Kimura | 327/352 |
| 5,561,392 | 10/1996 | Kimura | 327/350 |
| 5,576,653 | 11/1996 | Kimura | 327/356 |
| 5,578,965 | 11/1996 | Kimura | 330/254 |
| 5,581,210 | 12/1996 | Kimura | 327/355 |
| 5,581,211 | 12/1996 | Kimura | 327/356 |
| 5,587,682 | 12/1996 | Colli et al. | 327/359 |
| 5,617,052 | 4/1997 | Kimura | 327/357 |
| 5,631,594 | 5/1997 | Kimura | 327/352 |
| 5,640,121 | 6/1997 | Kimura | 330/252 |
| 5,668,750 | 9/1997 | Kimura | 327/356 |
| 5,712,810 | 1/1998 | Kimura | 327/359 |
| 5,721,507 | 2/1998 | Fujii et al. | 327/65 |

FOREIGN PATENT DOCUMENTS

A0672992  9/1995  European Pat. Off.  .......  G06G 7/163

OTHER PUBLICATIONS

J. Ramirez–Angulo, Highly Linear Four Quadrant Analogue BiCMOS Multiplier for +–1.5V Supply Operation, Electronics Letters, vol. 28, No. 19, pp. 1783–1785, Sep. 1992.

Barrie Gilbert, "A Precise Four–Quadrant Multiplier with Subnanosecond Response", *IEEE Journal of Solid–State Circuits*, Dec. 1968, pp. 365–373.

*Primary Examiner*—Timothy P. Callahan
*Assistant Examiner*—Terry L. Englund
*Attorney, Agent, or Firm*—Sughrue, Mion, Zinn, Macpeak & Seas, PLLC

[57] ABSTRACT

A differential circuit is provided, which makes it possible to realize an ideal linear behavior with respect to an input signal. This circuit includes a voltage-current converter, a current-voltage converter, and a triple-tail cell. The voltage-current converter converts an initial input voltage to generate first and second differential output currents. The current-voltage converter converts the first and second output currents to generate first and second output voltages. The triple-tail cell has first, second, and third transistors driven by a common constant current. The first and second transistors form a differential pair. The first and second output voltages are differentially applied across input ends of the differential pair. The third transistor serves as a bypass transistor for the common constant current. An input end of the third transistor is applied with a bias voltage. An output current of the differential circuit is derived from output ends of the differential pair. This circuit is preferably used for a multiplier.

18 Claims, 16 Drawing Sheets

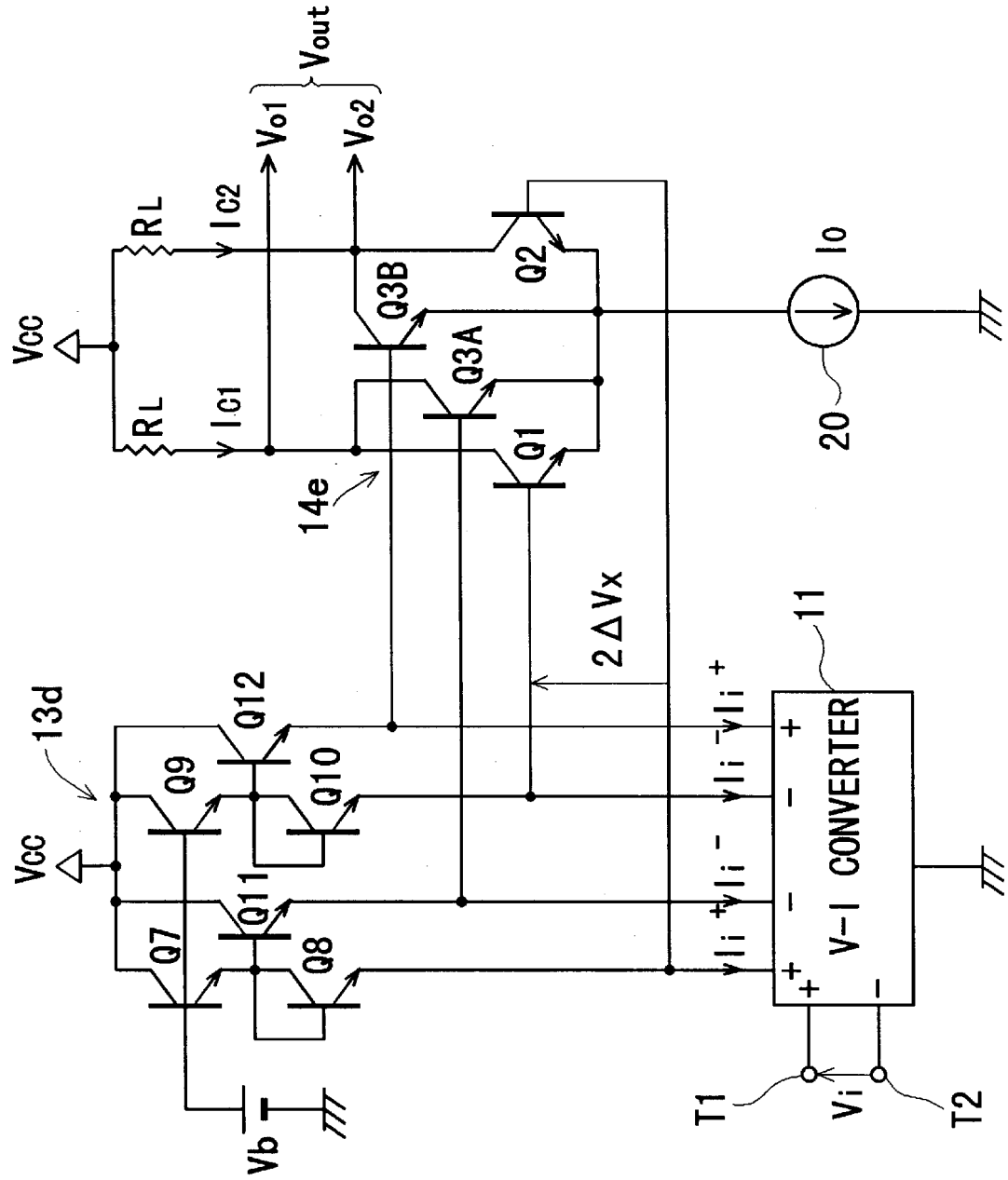

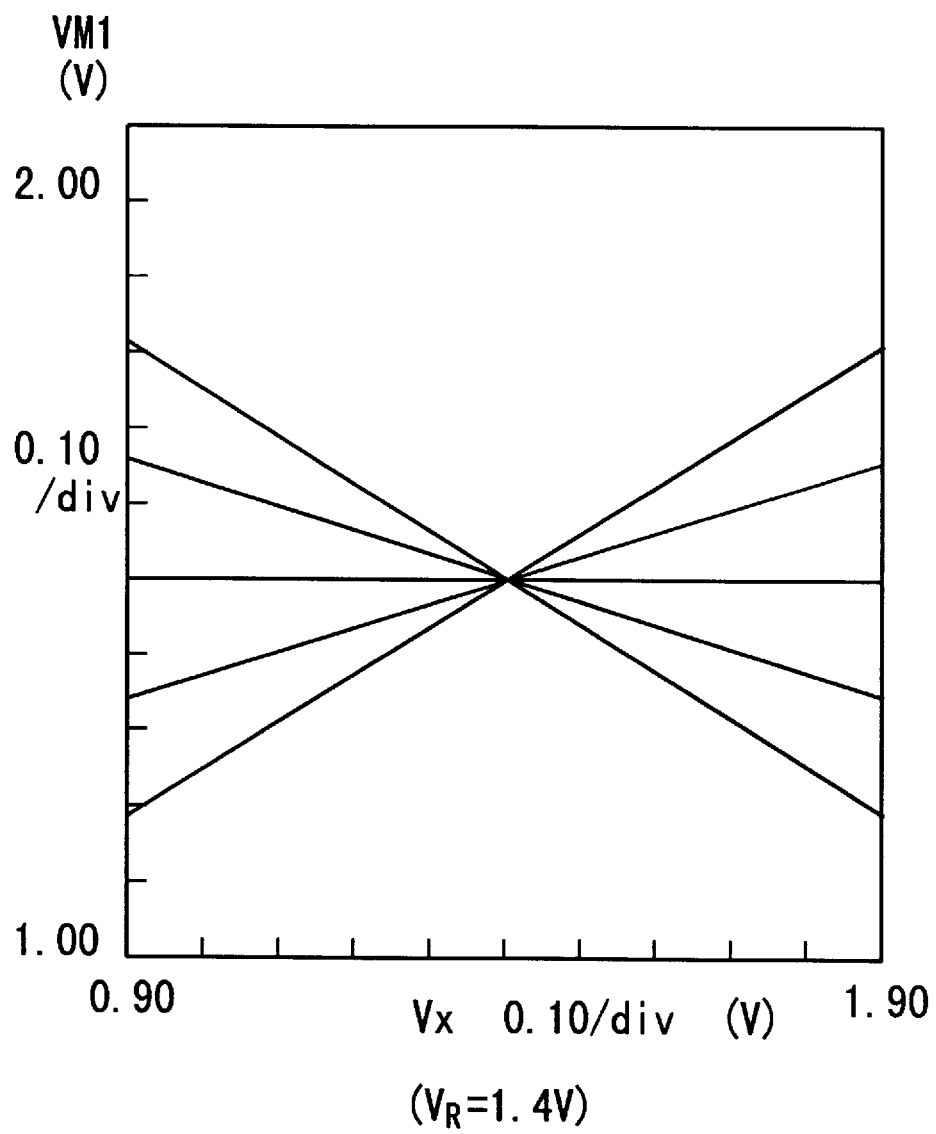

DIFFERENTIAL CIRCUIT AND MULTIPLIER

BACKGROUND OF THE INVENTION

1. Field of the Invention

The present invention relates to a differential circuit and a multiplier and more particularly, to a differential circuit having an ideal linear behavior with respect to an input signal, and a multiplier using the differential circuit, which is preferably formed on a semiconductor integrated circuit (IC).

2. Description of the Prior Art

A conventional differential circuit using a logarithmic converter is shown in IEEE Journal of Solid-State Circuits, Vol. SC-3, No.4, December 1968, pp 365–373, entitled "A Precise Four-Quadrant Multiplier with Subnanosecond Response", which was written by Barrie Gilbert.

The logarithmic conversion of the converter is realized on the basis of the following fact.

Supposing that the base-width modulation (i.e., the Early voltage) is ignored, the collector current $I_C$ and the base-to-emitter voltage $V_{BE}$ typically has the following relationship (1).

$$Ic = I_S \exp\left[\frac{V_{BE}}{V_T}\right] \quad (1)$$

In the equation (1), $I_s$ is the saturation current of the transistor, and $V_T$ is the thermal voltage defined as $$V_T kT/q \quad (2)$$

where k is the Boltzmann's constant, T is absolute temperature in degrees Kelvin, and q is the charge of an electron.

It is seen from the equation (1) that the logarithmic conversion is able to be realized by the use of the above relationship (1).

The multiplier disclosed in the above article is shown in FIG. 1, which corresponds to the circuit of FIG. 8 in the article. In FIG. 1, the reference numeral 61 indicates the well-known Gilbert multiplier cell, the reference numeral 62 indicates a logarithmic converter as an input circuit for the multiplier cell 61, the reference numeral 65 indicates emitter-degeneration resistors, and the reference numeral 85 indicates load resistors of the multiplier cell 61.

The logarithmic conversion of the input circuit 62 is performed by the use of the equation (1). Specifically, two bipolar transistors 71 and 72 constitute an emitter-coupled pair, and two diode-connected bipolar transistors 73 and 74 serve as loads for the respective transistors 71 and 72. A differential input voltage X is applied across bases of the transistors 71 and 72. Two output voltages of the input circuit 62 are derived from the collectors of the transistors 71 and 72.

the collector current and the base-to-emitter voltage have the above relationship (1) and therefore, the two output voltages are equal to the logarithmically converted voltages of the input voltage X, respectively. These two output voltages are applied across bases of bipolar transistors 77,80 and 78,79 of the multiplier cell 61.

An input voltage Y is differentially applied across bass of bipolar transistors 75 and 76.

The multiplication result X·Y of the input voltages X and Y is differentially derived through the load resistors 85.

On the other hand, the combination of the Gilbert multiplier cell and a predistortion circuit was created by B. Gilbert, which has been termed the "Gilbert multiplier" and includes two "Gilbert gain cells". A differential circuit serving as the Gilbert gain cell is shown in FIG. 2.

As shown in FIG. 2, bipolar transistors Q101 and Q102 whose emitters are coupled together through an emitter resistor (resistance :R) form a differential pair of an input circuit. Two diode-connected bipolar transistors Q103 and Q104 constitute loads of the differential pair of the transistors Q101 and Q102. The transistors Q101 and Q102 are driven by constant currents $I_0$, respectively.

Bipolar transistors Q105 and Q106 whose emitters are coupled together form a differential pair of the Gilbert gain cell. The transistors Q105 and Q106 are driven by a common constant current $I_1$.

An input voltage $V_i$ is applied across bases of the transistors Q101 and Q102. Collector currents of the transistors Q101 and Q102 vary according to the change of the input voltage $V_i$. The change of the collector currents are derived through the load transistors Q103 and Q104 to thereby generate a logarithmically-compressed output voltage $V_o$ between the collectors of the transistors Q101 and Q102.

The logarithmically-compressed output voltage $V_o'$ is then applied across bases of the transistors Q105 and Q106. The differential pair of the transistors Q105 and Q106 amplifies voltage $V_o$ to generate a differential output current $\Delta I_C$ between collectors of the transistors Q105 and Q106.

As described above, in the Gilbert gain cell, the diode-connected transistors Q103 and Q104 serving as the loads for the transistors Q101 and Q102 constitute a predistortion circuit for the transistors Q105 and Q106.

In the differential circuit of FIG. 2, when a current flowing through the emitter resistor of the transistors Q101 and Q102 and base-to-emitter voltages thereof are defined as i, $V_{BE1}$ and $V_{BE2}$, respectively, the following equation (3) is established.

$$V_i = V_{BE1} - V_{BE2} + Ri \quad (3)$$

Here, supposing that $(Ri \gg V_{BE1} - V_{BE2})$ is established, the following equation (4) is obtained.

$$i = \frac{V_i - (V_{BE1} - V_{BE2})}{R} \approx \frac{V_i}{R} \quad (4)$$

The current if lows through the load transistors Q103 and Q104 as a differential current. The inter-terminal voltage $V_o$ of the diode-connected transistors Q103 and Q104 is equal to a voltage obtained by logarithmically compressing the input voltage $V_i$. The output voltage $C_o$ of the differential pair of the transistors Q101 and Q102 is then exponentially expanded and amplified by the differential pair of the transistors Q105 and Q106, thereby generating the differential output current $\Delta UI_C$. The differential output current $\Delta I_C$ caries proportionally to the current i and the input voltage $V_i$.

With the conventional differential circuit of FIG. 2, since an approximation is performed by the use of the equation (4), a problem that the differential output current $\Delta I_C$ does not vary completely proportional to the differential input voltage $V_i$ occurs. In other words, the conventional differential circuit of FIG. 2 has a problem that it does not perform a completely (or, ideal) linear behavior with respect to the differential input voltage $V_i$.

SUMMARY OF THE INVENTION

Accordingly, an object of the present invention is to provide a differential circuit that makes it possible to realize an ideal linear behavior with respect to an input signal.

Another object of the present invention is to provide a multiplier that makes it possible to realize an ideal multiplication behavior.

The above objects together with others not specifically mentioned will become clear to those skilled in the art from the following description.

According to a first aspect of the present invention, a differential circuit is provided, which includes a voltage-current converter, a current-voltage converter, and a triple-tail cell.

The voltage-current converter converts an initial input voltage to generate first and second output currents. The first and second output currents have opposite polarities to each other and vary according to the initial input voltage, respectively.

the current-voltage converter converts the first and second output currents to generate first and second output voltages.

The triple-tail cell has first, second, and third transistors driven by a common constant current. The first and second transistors form a differential pair. The first and second output voltages are differentially applied across input ends of the differential pair. The third transistor serves as a bypass transistor for the common constant current. An input end of the third transistor is applied with a bias voltage.

An output current of the differential circuit is derived from output ends of the differential pair.

With the differential circuit according to the first aspect of the present invention, the initial input voltage is converted by the voltage-current converter to thereby generate the first and second output currents. The first and second output currents are converted by the current-voltage converter to thereby generate the first and second output voltages.

The first and second output voltages thus generated are then differentially applied across the input ends of the differential pair of the triple-tail cell. The output current of the differential circuit is derived from the output ends of the differential pair.

Accordingly, an ideal linear behavior of the differential circuit with respect to an input signal can be realized.

In a preferred embodiment of the differential circuit according to the first aspect, the first and second transistors have the same capability and said third transistor has a capability twice as much as those of said first and second transistors.

Here, the word "capability" means to emitter area for a bipolar transistor.

In another preferred embodiment of the differential circuit according to the first aspect, the bias voltage of the third transistor is generated by using one of the first and second output voltages.

In still another preferred embodiment of the differential circuit according to the first aspect, first and second resistors are further provided.

The first resistor is connected to one of the input ends of the differential pair and the input end of the third transistor. The second resistor is connected to the other of the input ends of the differential pair and the input end of the third transistor.

According to a second aspect of the present invention, another differential circuit is provided, which includes a voltage-current converter, a current-voltage converter, and a triple-tail cell.

The voltage-current converter converts an initial input voltage to generate first and second output currents. The first and second output currents have opposite polarities to each other and varying according to the initial input voltage, respectively.

The current-voltage converter converts the first and second output currents to generate first and second output voltages.

The triple-tail cell has first, second, third, and fourth transistors driven by a common constant current. The first and second transistors form a differential pair. The first and second output voltages are differentially applied across input ends of the differential pair. The third and fourth transistors serve as bypass transistors for the common constant current. An input end the third transistor is applied with a first bias voltage. An input end of the fourth transistor is applied with a second bias voltage.

An output current of the differential circuit is derived from at least one output end of the differential pair.

Since the differential circuit according to the second aspect of the invention corresponds to one obtained by replacing the third transistor of the first aspect with two transistors (i.e., the third and fourth transistors), the same advantage as that of the first aspect is obtained.

In a preferred embodiment of the differential circuit according to the second aspect, the first, second, third, and fourth transistors have the same capability as each other.

In another preferred embodiment of the differential circuit according to the second aspect, the first bias voltage of the third transistor and the second bias voltage of the fourth transistor are equal to each other and generated by using one of the first and second output voltages, respectively.

In another preferred embodiment of the differential circuit according to the second aspect, first and second resistors are further provided.

The first resistor is connected to one of the input ends of the differential pair and the input end of the third transistor, and the second resistor is connected to the other of the input ends of the differential pair and the input end of the fourth transistor.

In still another preferred embodiment of the differential circuit according to the second aspect, the first bias voltage of the third transistor is generated by using the first output voltage, and the second bias voltage of the fourth transistor is generated by using the second output voltage.

In another preferred embodiment of the differential circuit, output ends of the third and fourth transistors are connected to output ends of the differential pair, respectively.

According to a third aspect of the present invention, a multiplier is provided, which includes a first voltage-current converter, a current-voltage converter, a second voltage-current converter, a first triple-tail cell, and a second triple-tail cell.

The first voltage-current converter converts the first initial input voltage to generate first and second output currents. The first and second output currents having opposite polarities to each other and varying according to the first initial input voltage, respectively.

The current-voltage converter converts the first and second output currents to generate first and second output voltages.

The second voltage-current converter converts the second initial input voltage to generate third and fourth output currents. The third and fourth output currents have opposite polarities to each other and varying according to the second initial input voltage, respectively.

The first triple-tail cell has first, second, and third transistors driven by the third output current. The first and second transistors form a first differential pair. The first and second output voltages are differentially applied across input ends of the first differential pair of the first and second transistors. The third transistor serves as a bypass transistor for the third output current. An input end of the third transistor is applied with a first bias voltage.

The second triple-tail cell has fourth, fifth, and sixth transistors driven by the fourth output current. The fourth and fifth transistors form a second differential pair. The first and second output voltages are differentially applied across input ends of the second differential pair of the fourth and fifth transistors. The sixth transistor serves as a bypass transistor for the fourth output current. An input end of the sixth transistor is applied with a second bias voltage.

Output ends of the first and fourth transistors are coupled together, and output ends of the second and fifth transistors are coupled together.

an output of the multiplier is derived from the coupled output ends of the first differential pair and those of the second differential pair.

The multiplier according to the third aspect uses two triple-tail cells of the differential circuit according to the first aspect and therefore, an ideal multiplication behavior can be realized.

In a preferred embodiment of the multiplier according to the third aspect, the first and second transistors have the same capability and the third transistor has a capability twice as much as those of the first and second transistors. The fourth and fifth transistors have the same capability and the sixth transistor has a capability twice as much as those of the fourth and fifth transistors.

In another preferred embodiment of the multiplier according to the third aspect, the first and second bias voltages of the third and sixth transistors are equal to each other and generated by using one of the first and second output voltages.

In still another preferred embodiment of the multiplier according to the third aspect, first, second, third, and fourth resistors are further provided.

The first resistor is connected to one of the input ends of the first differential pair and the input end of the third transistor. The second resistor is connected to the other of the input ends of the first differential pair and the input end of the third transistor.

The third resistor is connected to one of the input ends of the second differential pair and the input end of the sixth transistor. The fourth resistor is connected to the other of the input ends of the second differential pair and the input end of the third transistor.

According to a fourth aspect of the present invention, another multiplier is provided, which includes a first voltage-current converter, a current-voltage converter, a second voltage-current converter, a first triple-tail cell, and a second triple-tail cell.

The first voltage-current converter converts the first initial input voltage to generate first and second output currents. The first and second output currents have opposite polarities to each other and varying according to the first initial input voltage, respectively.

The current-voltage converter converts the first and second output currents to generate first and second output voltages.

The second voltage-current converter converts the second initial input voltage to generate third and fourth output currents. The third and fourth output currents have opposite polarities to each other and varying according to the second initial input voltage, respectively.

The first triple-tail cell has first, second, third, and fourth transistors driven by the third output current. The first and second transistors form a first differential pair. The first and second output voltages are differentially applied across input ends of the differential pair of the first and second transistors. The third and fourth transistors serve as bypass transistors for the third output current. An input end of the third transistor is applied with a first bias voltage, and an input end of the fourth transistor is applied with a second bias voltage.

The second triple-tail cell has fifth, sixth, seventh, and eighth transistors driven by the fourth output current. The fifth and sixth transistors form a second differential pair. The first and second output voltages are differentially applied across input ends of the second differential pair of the fourth and fifth transistors. The seventh and eighth transistors serve as bypass transistors for the fourth output current. An input end of the seventh transistor is applied with a third bias voltage, and an input end of the eighth transistor is applied with a fourth bias voltage. Output ends of the first and fifth transistors are coupled together, and output ends of the second and sixth transistors are coupled together.

An output of the multiplier is derived from at least one of the coupled output ends of the first differential pair and those of the second differential pair.

In a preferred embodiment of the multiplier according to the fourth aspect, the first, second, third, and fourth transistors have the same capability as each other, and the fifth, sixth, seventh, and eighth transistors have the same capability as each other.

In another preferred embodiment of the multiplier according to the fourth aspect, the first, second, third, and fourth bias voltages of the third, fourth, seventh, and eighth transistors are equal to each other and are generate by using one of the first and second output voltages, respectively.

In still another preferred embodiment of the multiplier according to the fourth aspect, first, second, third, and fourth resistors are further provided.

The first resistor is connected to one of the input ends of the first differential pair and the input end of the third transistor, and the second resistor is connected to the other of the input ends of the first differential pair and the input end of the fourth transistor.

The third resistor is connected to one of the input ends of the second differential pair and the input end of the seventh transistor, and the fourth resistor is connected to the other of the input ends of the second differential pair and the input end of the eighth transistor.

In a further preferred embodiment of the multiplier according to the fourth aspect, the first bias voltage of the third transistor is generated by using the first output voltage, and the second bias voltage of the fourth transistor is generated by using the second output voltage. The third bias voltage of the seventh transistor is generated by using the first output voltage, and the fourth bias voltage of the eighth transistor is generated by using the second output voltage.

In still a further preferred embodiment of the multiplier according to the fourth aspect, output ends of the third and fourth transistors are connected to output ends of the first differential pair, respectively, and output ends of the seventh and eighth transistors are connected to output ends of the second differential pair, respectively.

The multiplier according to the fourth aspect corresponds to one obtained by replacing each of the third and sixth transistors of the third aspect with two transistors and therefore, the same advantage as that of the third aspect is obtained.

BRIEF DESCRIPTION OF THE DRAWINGS

In order that the present invention may be readily carried into effect, it will now be described with reference to the accompanying drawings.

FIG. 8A is a circuit diagram of a differential circuit according to a eleventh embodiment of the invention.

FIG. 10 is a diagram showing the transfer characteristic of the multiplier according to the fourth embodiment of FIG. 4B, in which the V-I converter circuit of FIG. 9 is used.

DETAILED DESCRIPTION OF THE PREFERRED EMBODIMENTS

Figure 1:
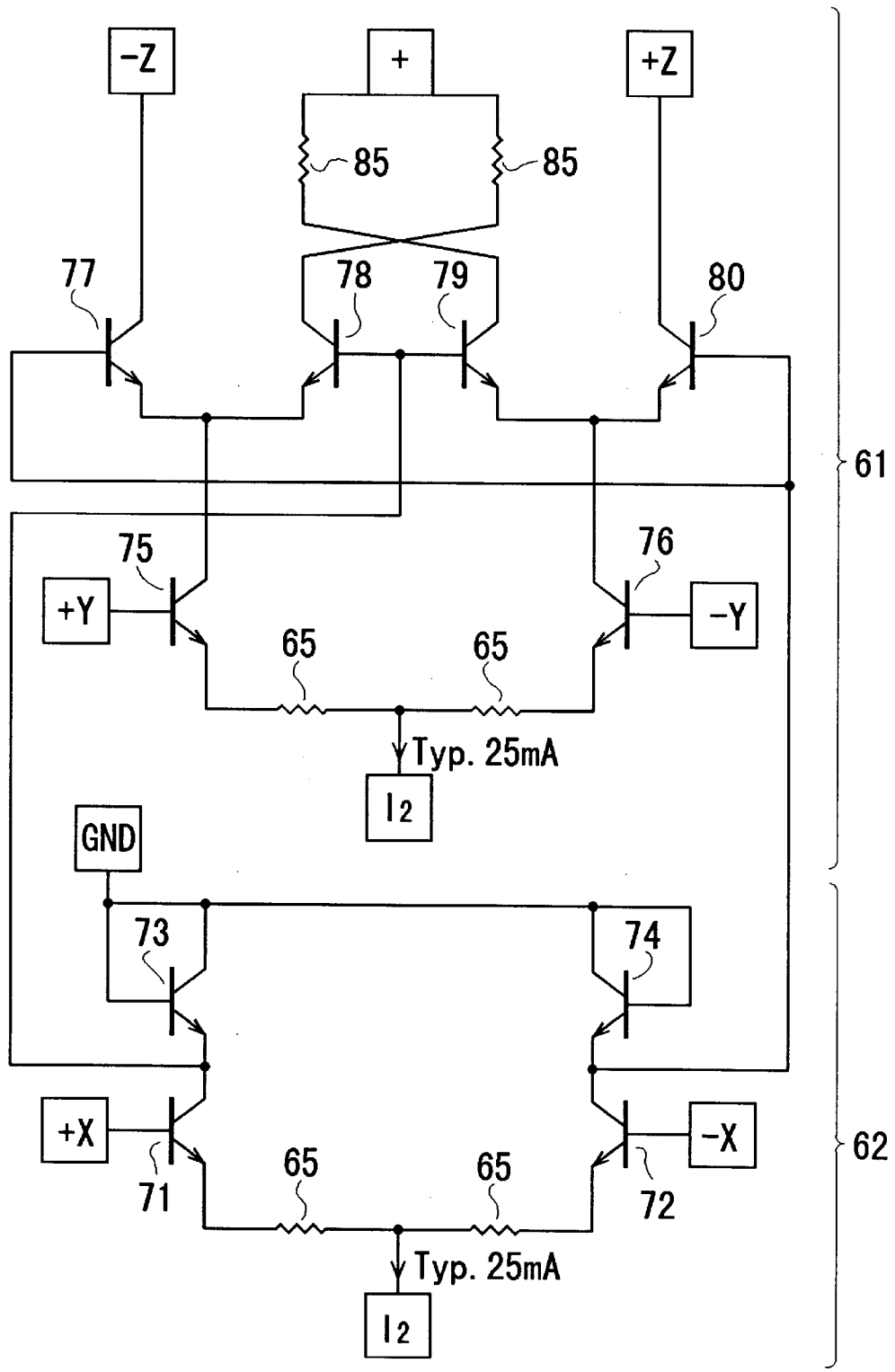
FIG. 1 is a circuit diagram of the well-known Gilbert multiplier.
Figure 2:
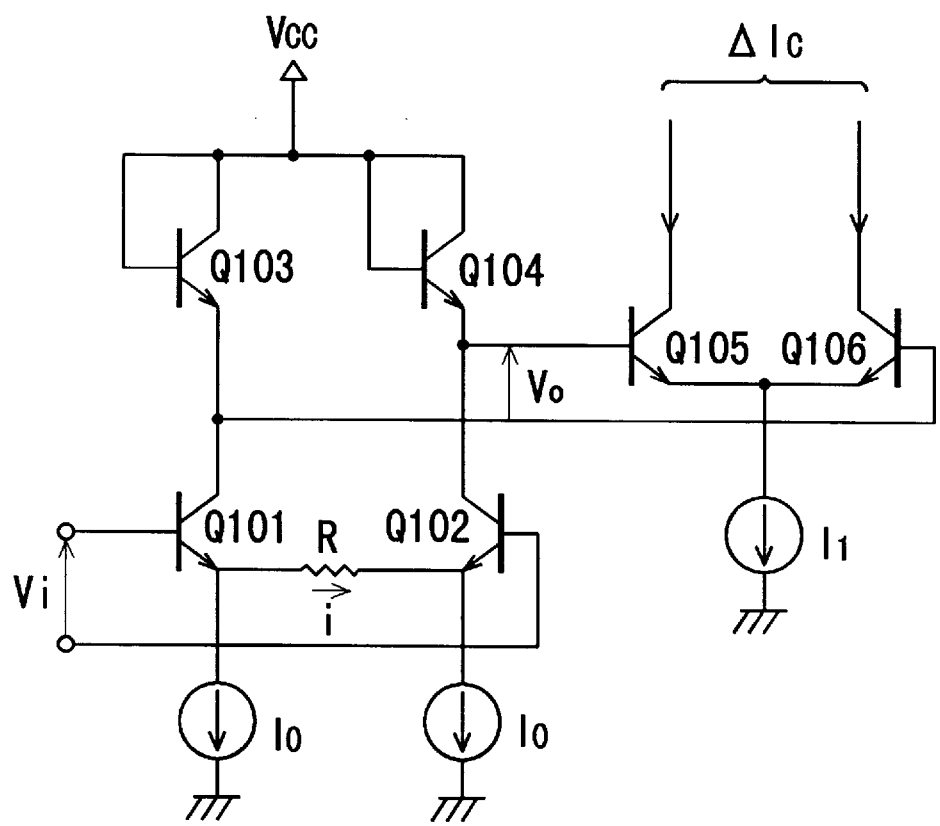
FIG. 2 is a circuit diagram of a conventional differential circuit serving as the well-known Gilbert gain cell.

Preferred embodiments of the present invention will be described in detail below while referring to the drawings attached.

FIRST EMBODIMENT

Figure 3A:
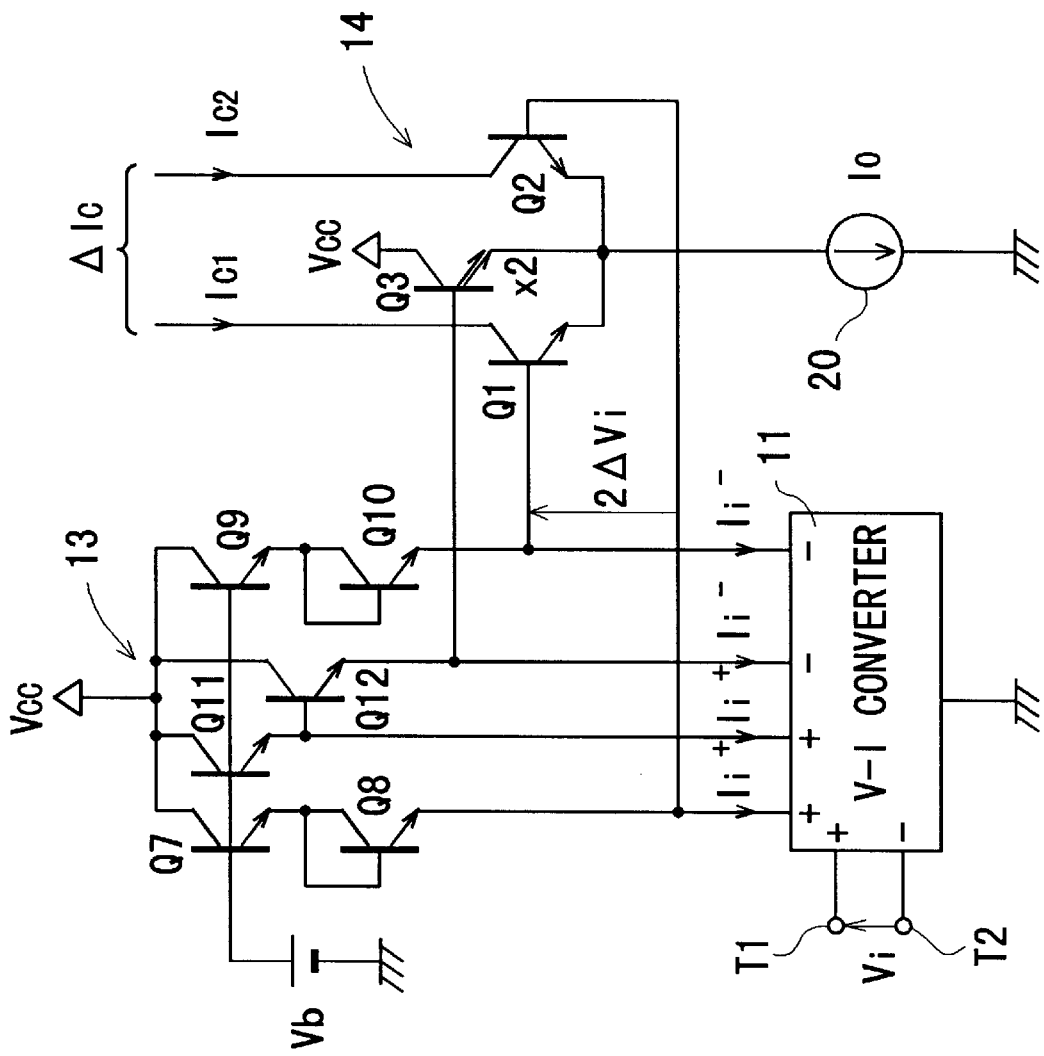
FIG. 3A is a circuit diagram of a differential circuit according to a first embodiment of the invention.

A differential circuit according to a first embodiment of the present invention is shown in FIG. 3A.

As shown in FIG. 3A, this differential circuit includes a voltage-current converter (V-I converter) 11, a current-voltage converter (I-V converter) 13, and a triple-tail cell 14.

The V-I converter 11 receives an initial input voltage $V_i$ through its input terminals T1 and T2, and converts the voltage $V_i$ to thereby generate first and second output currents $I_1^+$ and $I_1^-$. The first and second output currents $I_i^+$ and $I_i^-$ have opposite polarities to each other and vary according to the initial input voltage $V_i$, respectively. In other words, the first and second output currents $I_i^+$ and $I_i^-$ are differential currents corresponding to the initial input voltage $V_i$.

The positive-phase current $I_i^+$ is outputted through first and second positive-phase output terminals of the V-I converter 11. The current $I_i^-$ is outputted through first and second negative-phase output terminals thereof.

The logarithmic I-V converter 13 logarithmically converts the first and second output currents $I_i^+$ and $Li_i^-$ to thereby generate first and second output voltages.

Specifically, the logarithmic I-V converter 13 includes six npn bipolar transistors Q7, Q8, Q9, Q10, Q11 and Q12.

The transistor Q8 is diode-connected and has an emitter connected to the first positive-phase output terminal of the V-I converter 11. The transistor Q8 has a collector and a base coupled together to be connected to an emitter of the transistor Q7. The transistor Q8 serves as a load for generating the second output voltage from the first output current $I_i^+$. The second output voltage is derived at the emitter of the transistor Q8.

The transistor Q10 is diode-connected and has an emitter connected to one of the two negative-phase output terminals. The transistor Q10 has a collector and a base coupled together to be connected to an emitter of the transistor Q9. The transistor Q10 serves as a load for generating the first output voltage from the second output current $I_i^-$. The first output voltage is derived at the emitter of the transistor Q10.

The transistor Q7 has an emitter connected to the coupled base and collector of the transistor Q8, a base applied with a constant bias voltage $V_b$, and collector applied with a power supply voltage $V_{CC}$.

The transistor Q9 has an emitter connected to the coupled base and collector of the transistor Q10, a base applied with the constant bias voltage $V_b$, and a collector applied with the power supply voltage $V_{CC}$.

The transistor Q11 has an emitter connected to the second positive output terminal of the V-I converter 11, a base applied with the constant bias voltage $V_b$, and a collector applied with the power supply voltage $V_{CC}$. The transistor Q11 is driven by the first output current $I_i^+$.

The transistor Q12 has an emitter connected to the second negative output terminal of the V-I converter 11, a base connected to the second positive output terminal of the V-I converter 11, and a collector applied with the power supply voltage $V_{CC}$. The transistor Q12 is driven by the second output current $I_i^-$.

The triple-tail cell 14 has three npn bipolar transistors Q1, Q2, and Q3 whose emitters are coupled together to be connected to one end of a constant current sink 20 (current: $I_C$). the other end of the sink 20 is connected to the ground. The transistors Q1, Q2, and Q3 are driven by the common constant current $I_0$.

The emitter areas of the transistors Q1 and Q2 are the same. The emitter area of the transistor Q3 is K times as much as those of the transistors Q1 and Q2, where K is a positive constant greater than unity (i.e., K>1). Here, the value of K is set as K=2.

The transistors Q1 and Q2 form a differential pair. A base of the transistor Q1 is applied with the first output voltage, and a base of the transistor Q2 is applied with the second output voltage. In other words, the differential voltage $2\Delta V_i$ is applied across bases of the transistors Q1 and Q2, in other words, input ends of the differential pair.

the transistor Q3 serves s a bypass transistor for the common constant current $I_0$. An input end or base of the transistor Q3 is connected to the emitter of the transistor Q12 of the I-V converter 13 to be applied with a bias voltage.

A differential output current $\Delta I_C$ of the differential circuit, which is defined as $\Delta I_C = I_{C1} - I_{C2}$, is derived from output ends of the differential pair, where $I_{C1}$ is a collector current of the transistor Q1, and $I_{C2}$ is a collector current of the transistor Q2.

Supposing that the V-I converter 11 has an ideal converter behavior, the first and second output currents $I_i^+$ and $I_i^-$ are given by the following equations (5) and (6), respectively, $$I_i^+ = \tfrac{1}{2}(I_{00} + GV_i) \tag{5}$$

$$I_i^- = \tfrac{1}{2}(I_{00} - GV_i) \tag{6}$$

where $I_{00}$ is a constant current and G is a conductance of the V-I converter 11.

The first and second output currents $I_i^+$ and $I_i^-$ are logarithmically compressed by the p-n junctions of the cascode-connected transistors Q11 and Q12. The differential input voltage $\Delta V_i$ of the triple-tail cell 14 is expressed by the following equation (7) using the previously described equation (1).

$$\Delta V_i = 2V_T \ln\left[\frac{I_i^+}{I_S}\right] - 2V_T \ln\left[\frac{I_i^-}{I_S}\right] \tag{7}$$

$$= 2V_T \ln\left[\frac{I_i^+}{I_i^-}\right]$$

Therefore, the differential output current $\Delta I_C$ of the triple-tail cell 14 (i.e., the differential circuit) is expressed as the following equation (8).

$$\Delta I_C = \frac{I_0 \sinh\left[\dfrac{\Delta V_i}{2V_T}\right]}{\cosh\left[\dfrac{\Delta V_i}{2V_T}\right] + \dfrac{K}{2}\exp\left[\dfrac{V_C}{V_T}\right]} \tag{8}$$

where $V_C$ is the base voltage of the transistor Q3.

Here, considering the formula of $$\tanh\left(\frac{x}{2}\right) = \frac{\sinh x}{\cosh x + 1},$$

the differential output current $\Delta I_C$ can be expressed as the following equation (9) by setting $(K/2)\exp(V_C/V_T) = 1$ in the equation (8).

$$\Delta I_C = \frac{[I_i^+]^2 - [I_i^-]^2}{[I_i^+ + I_i^-]^2} I_0 \tag{9}$$

$$= \frac{I_i^+ - I_i^-}{I_i^+ + I_i^-} I_0$$

By substituting the above equations (5) and (6) into the equation (9), the differential output current $\Delta I_C$ can be rewritten as the following equation (10).

$$\Delta I_C = \frac{GV_i I_0}{I_{00}} \tag{10}$$

It is seen from the equation (10) that the differential output current $\Delta I_C$ is proportional to the input voltage $V_i$, in other words, the differential output current $\Delta I_C$ varies completely linearly with respect to the input voltage $V_i$. This means that the differential circuit according to the first embodiment of FIG. 3A has an ideal linear behavior with respect to the input voltage $V_i$.

SECOND EMBODIMENT

Figure 3B:
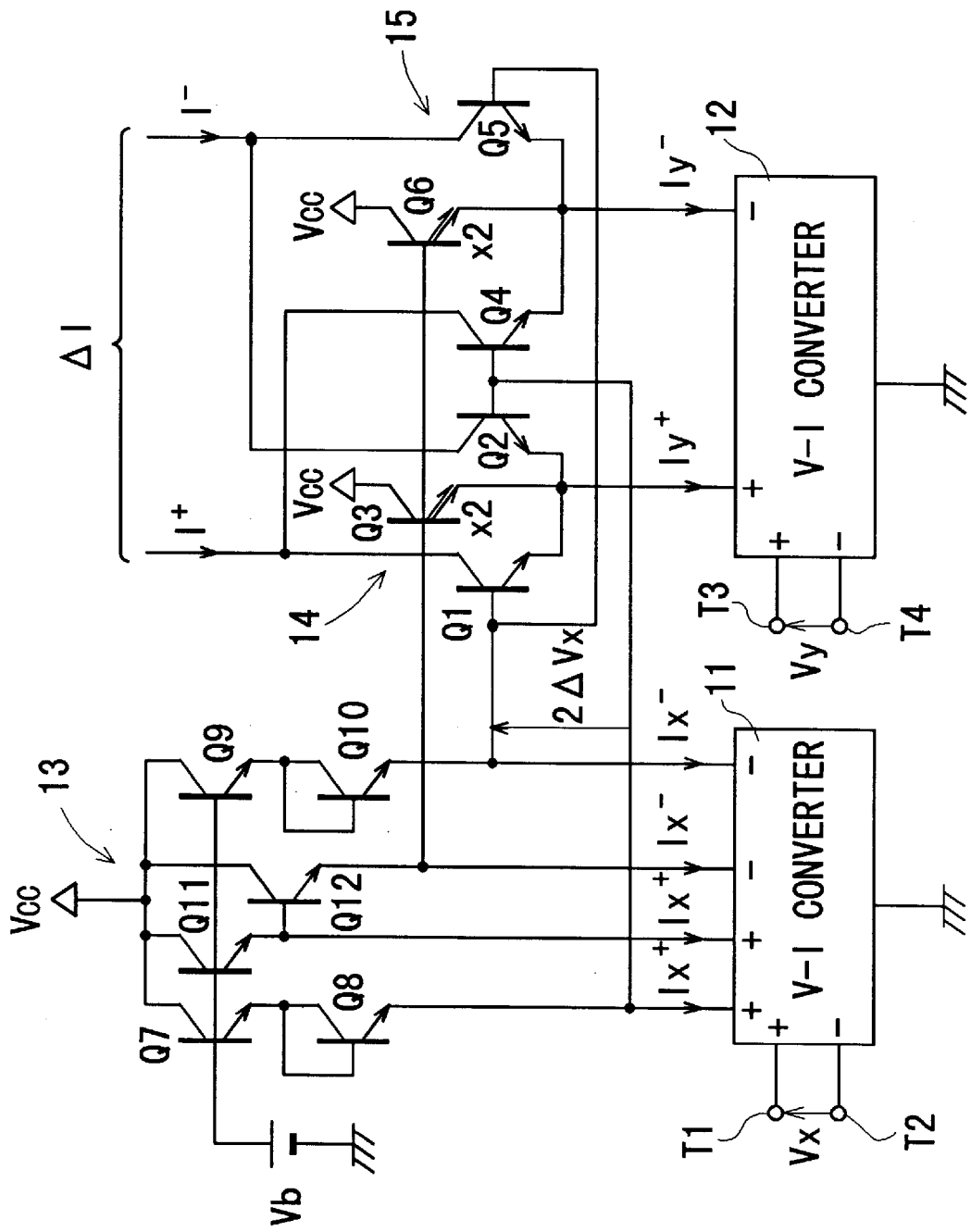
FIG. 3B is a circuit diagram of a multiplier according to a second embodiment of the invention, in which the differential circuit of FIG. 3A is used.

A multiplier according to a second embodiment of the present invention is shown in FIG. 3B, which is equivalent to a circuit obtained by adding a V-I converter 12 and a triple-tail cell 15 into the differential circuit according to the first embodiment of FIG. 3A.

Therefore, the description about the same configuration is omitted here by adding the same reference characters as those in the first embodiment to the corresponding elements for the sake of simplification.

As shown in FIG. 3B, the coupled emitters of the transistors Q1, Q2, and Q3 of the triple-tail cell 14 are connected to a positive-phase output terminal of the V-I converter 12. The triple-tail cell 14 is driven by an output current $I_y^+$ of the converter 12. The transistor Q3 serves as a bypass transistor for the current $I_y^+$. An input end or base of the transistor Q3 is connected to the emitter of the transistor Q12 of the I-V converter 13 to be applied with a bias voltage.

The triple-tail cell 15 has three npn bipolar transistors Q4, Q5, and Q6 whose emitters are coupled together to be connected to a negative-phase output terminal of the V-I converter 12. The triple-tail cell 15 is driven by an output current $I_y^-$ of the converter 12.

The emitter areas of the transistors Q4 and Q5 are the same as those of the transistors Q1 and Q2. The emitter area of the transistor Q6 is K times as much as those of the transistors Q4 and Q5, where K=2.

The transistors Q4 and Q5 form a differential pair. A base of the transistor Q4 is applied with the second output voltage, and a base of the transistor Q5 is applied with the first output voltage. In other words, the differential voltage $2\Delta V_x$ is applied across the bases of the transistors Q4 and Q5, in other words, input ends of the differential pair.

The transistor Q6 serves as a bypass transistor for the current $I_y^-$. An input end or base of the transistor Q6 is connected to the emitter of the transistor Q12 of the I-V converter 13 to be applied with the same bias voltage as that of the transistor Q3.

A collector of the transistor Q4 is connected to the collector of the transistor Q1 and a collector of the transistor Q5 is connected to the collector of the transistor Q2. In other words, the collectors of the transistors Q4 and Q5 are cross-coupled with those of the transistors Q1 and Q2, respectively.

A differential output current $\Delta I$ of the multiplier, which is defined as $\Delta I_C = I^+ - I^-$, is derived from coupled output ends of the differential pairs, where $I^+$ is a collector current flowing through the coupled collectors of the transistors Q1 and Q4, and $I^-$ is a collector current flowing through the coupled collectors of the transistors Q2 and Q5.

From the above equation (10), the differential output current $\Delta I_{C1}$ of the triple-tail cell 14 is expressed as the following equation (10').

$$\Delta I_{C1} = \frac{G_x V_x I_y^+}{I_{00}} \tag{10'}$$

On the other hand, the output currents $I_y^+$ and $I_y^-$ can be expressed by the following equations (11) and (12), respectively.

$$I_y^+ = \tfrac{1}{2}(I_{01} + G_y V_y) \tag{11}$$

$$I_y^- = \tfrac{1}{2}(I_{01} - G_y V_y) \tag{12}$$

For the triple-tail cell 15, the following equation (13) is established, $$\Delta I_{C2} = I_y^- \frac{\sinh\left[\frac{\Delta V_x}{2V_T}\right]}{\cosh\left[\frac{\Delta V_x}{2V_T}\right] + a} \qquad (13)$$

where a is a constant.

By setting a=1 in the equation (13), the following equation (14) is obtained.

$$\Delta I_{C2} = \frac{G_x V_x}{I_{00}} I_y^- \qquad (14)$$

Therefore, the differential output current ΔI of the multiplier is expressed as the following equation (15).

$$\begin{aligned}
\Delta I &= \Delta I_{C1} - \Delta I_{C2} \qquad (15)\\
&= G_x V_x (I_y^+ - I_y^-)\\
&= \frac{G_x G_y}{I_{00} I_{01}} V_x V_y
\end{aligned}$$

It is seen from the equation (15) that the differential output current ΔI is proportional to the product ($V_x \cdot V_y$) of the initial input voltages $V_x$ and $V_y$, in other words, the differential output current ΔI varies completely linearly with respect to the product ($V_x \cdot V_y$).

This means that the multiplier according to the second embodiment of FIG. 3B has an ideal multiplication behavior with respect to the input voltages $V_x$ and $V_y$.

THIRD EMBODIMENT

Figure 4A:
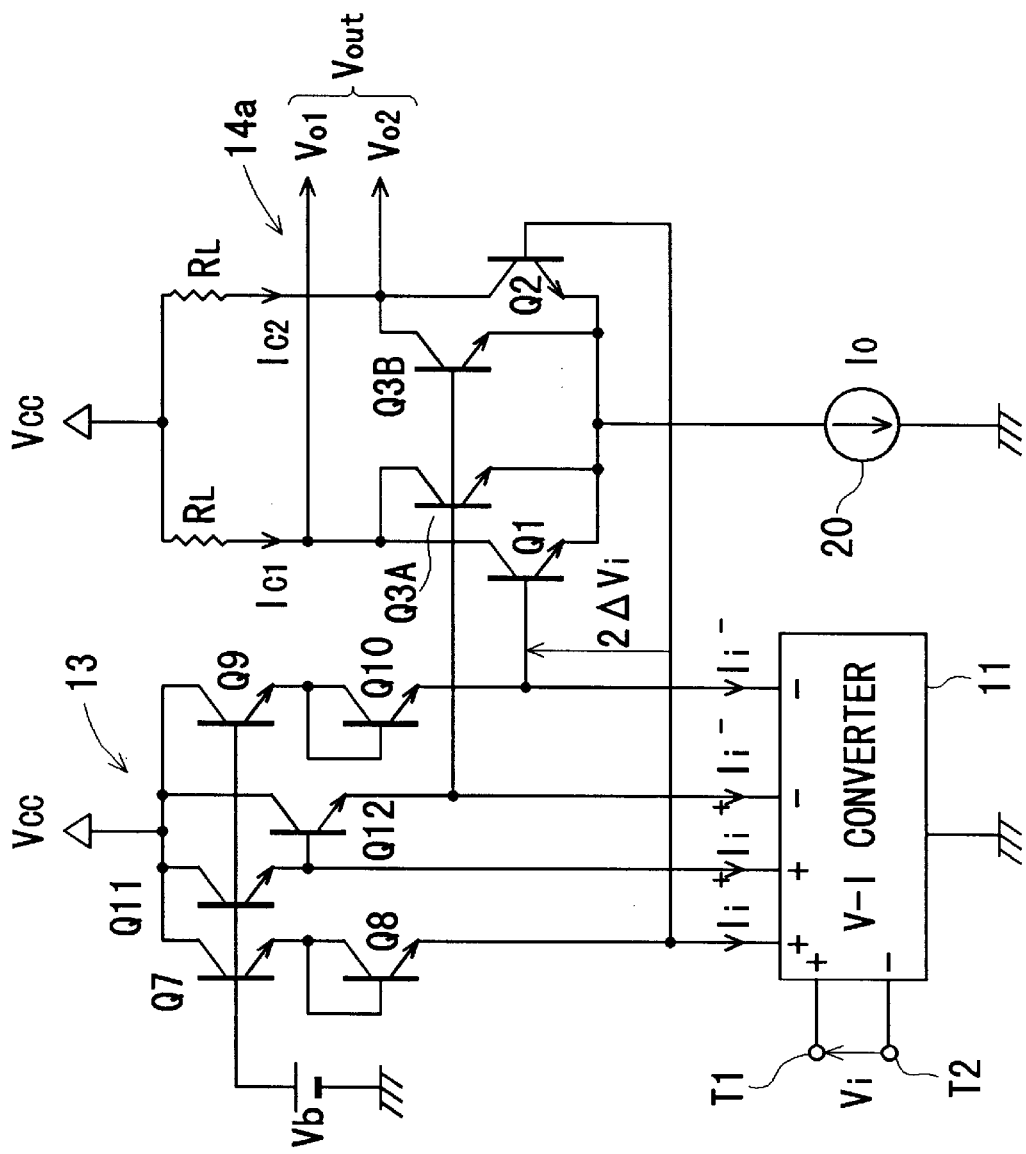
FIG. 4A is a circuit diagram of a differential circuit according to a third embodiment of the invention.

FIG. 4A shows a differential circuit according to a third embodiment of the present invention.

When the constant a is set as a=1 in the equation (13), $$a = 1 = \frac{K}{2} \exp\left(\frac{V_C}{V_T}\right)$$

is established.

Here, if the constant K is set as K=2, $$\exp\left(\frac{V_C}{V_T}\right) = 1$$

is established. This means that the base voltage of the transistor Q3 should be set to satisfy $V_C = V_T \ln 1 = 0$.

When the constant K is set as K=2, the emitter size or area of the transistor Q3 is twice as much as those of the transistors Q1 and Q2. This transistor Q3 can be replaced with two identical transistors Q3A and A3B whose emitter areas are the same, as shown in FIG. 4A. The transistors Q1, Q2, Q3A, and A3B form a triple-tail cell 14a.

Emitters of the transistors Q3A and Q3B are commonly connected to the coupled emitters of the transistors Q1 and Q2. Bases of the transistors Q3A and Q3B are coupled together to be applied with the bias voltage. Collectors of the transistors Q3A and Q3B are connected to the collectors of the transistors Q3A and Q3B are connected to the collectors of the transistors Q1 and Q2, respectively, and are applied with the power supply voltage $V_{CC}$ through load resistors (resistance: $R_L$).

Thus, the differential circuit according to the third embodiment has the same configuration as that of the first embodiment of FIG. 3A except that the third transistor Q3 in the first embodiment is replaced with the two npn bipolar transistors Q3A and Q3B.

Accordingly, the same advantage as that of the first embodiment is obtained in the differential circuit according to the third embodiment of FIG. 4A.

Additionally, two load resistors (resistance: $R_L$) are provided between the triple-tail cell 14a and the power source ($V_{CC}$). Since the same collector currents flow through the transistors Q3A and Q3B, the above equation (10) is satisfied even if these currents are added to the differential output current $\Delta I_C$. Therefore, the same advantage as that of the first embodiment is obtained.

It is important that $I_y^+ + I_y^- = I_{01}$ (=constant) is established. In this case, the dc operating point of the differential output current $\Delta I_C$ is set at a point of ($I_1/2$). Therefore, the current $\Delta I_C$ can be derived through a resistor load without the completely linear behavior.

In other words, one of two output voltages $V_{C1}$ and $V_{C2}$ can be derived through the corresponding load resistors, and a differential output voltage $V_{out}$ can be derived through the load resistors as an output of the differential circuit of FIG. 4A. This means that no differential currents as shown in the first embodiment of FIG. 3A are necessary and as a result, an additional advantage that the output circuit can be simplified occurs.

FOURTH EMBODIMENT

Figure 4B:
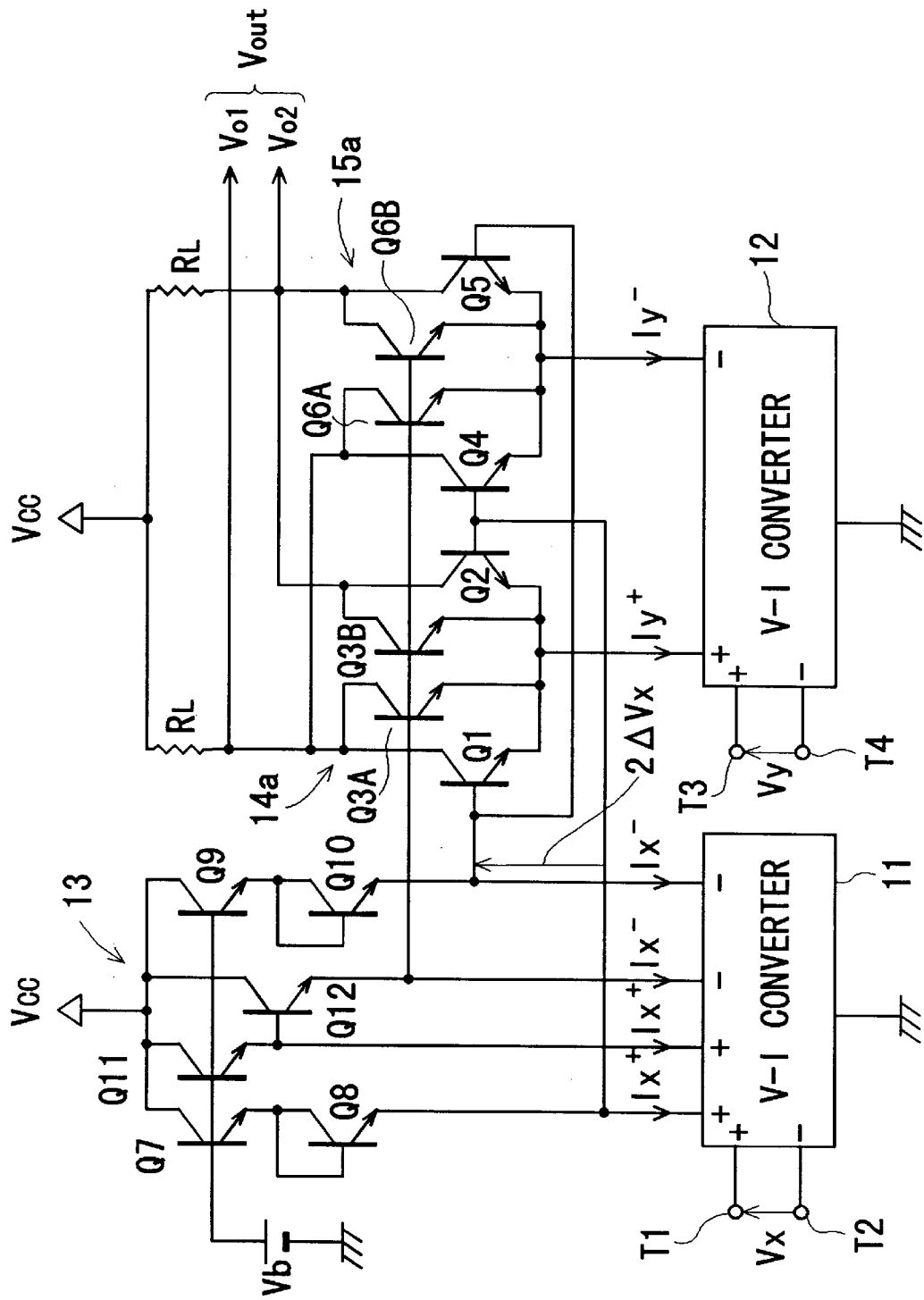
FIG. 4B is a circuit diagram of a multiplier according to a fourth embodiment of the invention, in which the differential circuit of FIG. 4A is used.

A multiplier according to a fourth embodiment of the present invention is shown in FIG. 4B, which is equivalent to a circuit obtained by adding a V-I converter 12 and a triple-tail cell 15a into the differential circuit according to the second embodiment of FIG. 4A.

Therefore, the description about the same configuration is omitted here by adding the same reference characters as those in the fist embodiment to the corresponding elements for the sake of simplification.

The multiplier according to the fourth embodiment has the same advantages or effects as those of the first embodiment of FIG. 3A, and an additional advantage that the output circuit can be simplified.

FIFTH EMBODIMENT

Figure 5A:
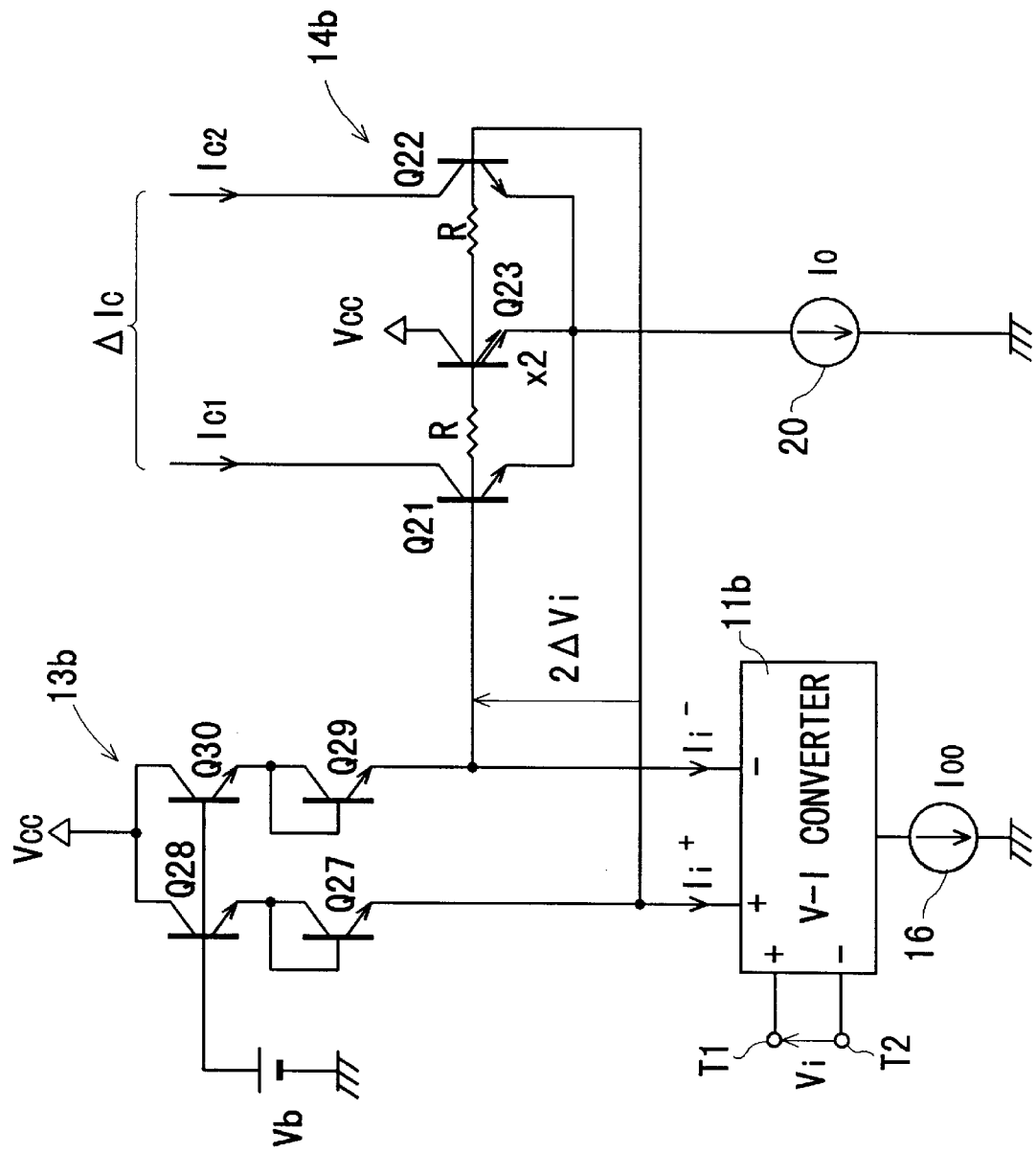
FIG. 5A is a circuit diagram of a differential circuit according to a fifth embodiment of the invention.

FIG. 5A shows a differential circuit according to a fifth embodiment of the present invention, which includes a V-I converter 11b, a constant current sink 16 (current: $I_{CC}$), an I-V converter 13b, and a triple-tail cell 14b.

The V-I converter 11b has the same function as that of the V-I converter 11 of FIG. 3A.

The I-V converter 13b converts the first and second output currents $I_i^+$ and $I_i^-$ to thereby generate first and second output voltages.

Specifically, the logarithmic I-V converter 13b includes four npn bipolar transistors Q27, Q28, Q29, and Q30.

The transistor Q27 is diode-connected and has an emitter connected to the positive-phase output terminal of the V-I converter 11b. The transistor Q27 serves as a load for generating the second output voltage from the first output current $I_i^+$. The second output voltage is derived at the emitter of the transistor Q27.

The transistor Q29 is diode-connected and has an emitter connected to the negative-phase output terminal of the V-I converter 11b. The transistor Q29 serves as a load for generating the first output voltage from the second output current $I_i^-$. The first output voltage is derived at the emitter of the transistor Q29.

The transistor Q28 has an emitter connected to the coupled base and collector of the transistor Q27, a base applied with a constant bias voltage $V_b$, and a collector applied with a power supply voltage $V_{CC}$.

The transistor Q30 has an emitter connected to the coupled base and collector of the transistor Q29, a base applied with the constant bias voltage $V_b$, and a collector applied with the power supply voltage $V_{CC}$.

The triple-tail cell 14b has three npn bipolar transistors Q21, Q22, and Q23 whose emitters are coupled together to be connected to one end of a constant current sink 20 (current: $I_0$). The other end of the sink 20 is connected to the ground. The transistors Q21, Q22, and Q23 are driven by the common constant current $I_0$.

The emitter areas of the transistors Q21 and Q22 are the same. The emitter area of the transistor Q23 is K times as much as those of the transistors Q21 and Q22, where K=2.

The transistors Q21 and Q22 form a differential pair. A base of the transistor Q21 is applied with the second output voltage, and a base of the transistor Q22 is applied with the first output voltage. In other words, the differential voltage $2\Delta V_i$ is applied across bases of the transistors Q21 and Q22, in other words, input ends of the differential pair.

The transistor Q23 serves as a bypass transistor for the common constant current $I_0$. An input end or base of the transistor Q23 is connected to the emitter of the transistor Q29 of the I-V converter 13b to be applied with a bias voltage.

A differential output current $\Delta I_C$ of the differential circuit, which is defined as $\Delta I_C = I_{C1} - I_{C2}$, is derived from output ends of the differential pair, where $I_{C1}$ is a collector current of the transistor Q21, and $I_{C2}$ is a collector current of the transistor Q22.

Two resistors (resistance: R) are additionally provided in this embodiment. One of the resistors is connected between the bases of the transistors Q21 and Q23, and the other is connected between the bases of the transistors Q22 and Q23.

In the differential circuit according to the fifth embodiment, an additional advantage that the I-V converter 13b can be simplified in configuration.

SIXTH EMBODIMENT

Figure 5B:
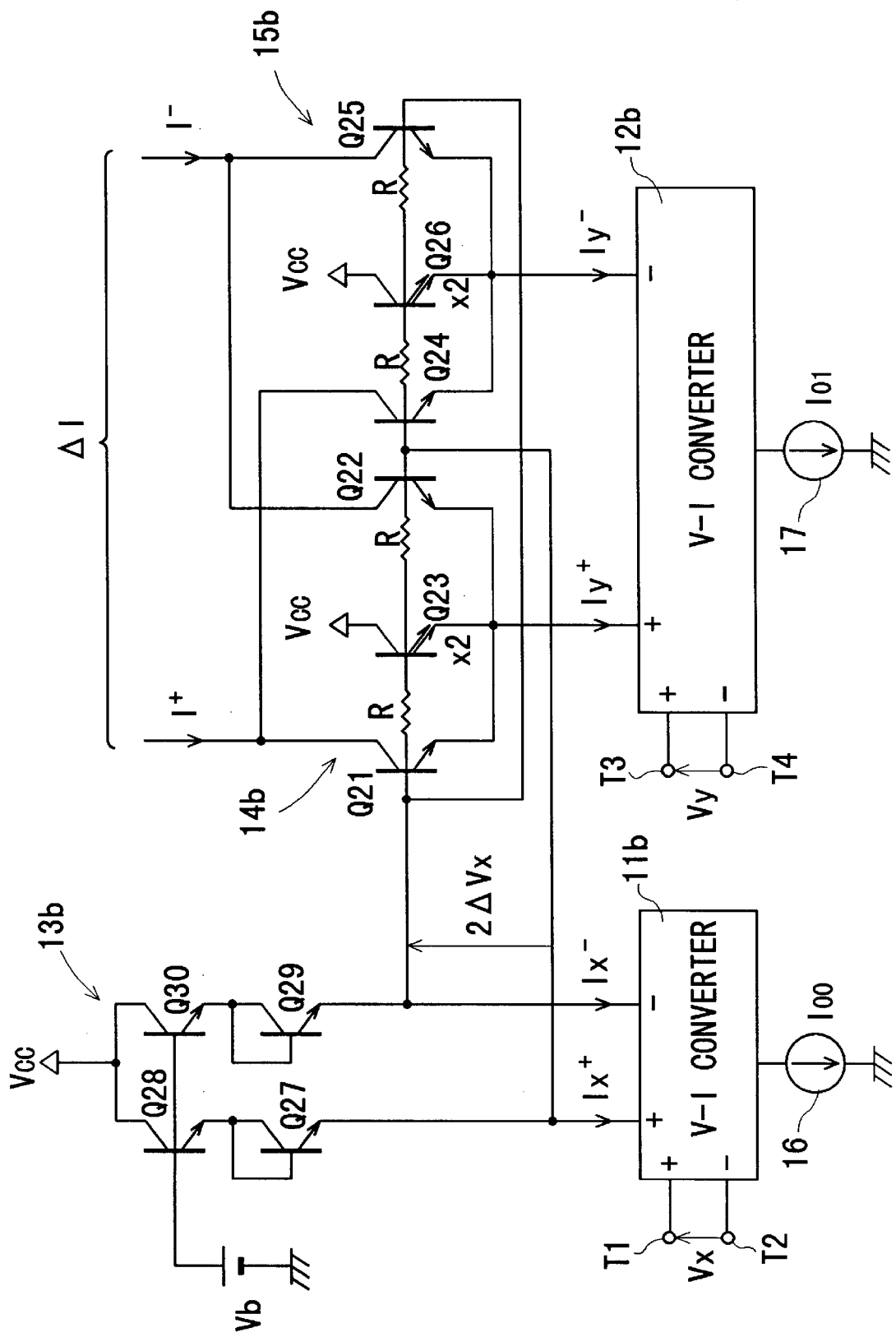
FIG. 5B is a circuit diagram of a multiplier according to a sixth embodiment of the invention, in which the differential circuit of FIG. 5A is used.

A multiplier according to a sixth embodiment of the present invention is shown in FIG. 5B, which is equivalent to a circuit obtained by adding a V-I converter 12b and a triple-tail cell 15b into the differential circuit according to the fourth embodiment of FIG. 5A.

The triple-tail cell 14b is driven by the positive-phase output current $I_y^-$ of the V-I converter 12b.

The triple-tail cell 15b has three npn bipolar transistors Q24, Q25, and Q26 whose emitters are coupled together, and is driven by the negative-phase output current $I_y^-$ of the V-I converter 12b.

The emitter areas of the transistors Q24 and Q25 are the same. The emitter area of the transistor Q26 is K times as much as those of the transistors Q24 and Q25, where K=2.

The transistors Q24 and Q25 form a differential pair. A base of the transistor Q26 is applied with a bias voltage, and a base of the transistor Q22 is applied with the same bias voltage as that of the transistor Q24. The transistor Q26 serves as a bypass transistor for the current $I_y^-$.

Two resistors (resistance: R) are additionally provided in this embodiment. One of the resistors is connected between the bases of the transistors Q24 and Q26, and the other is connected between the base of the transistors Q25 and Q26.

In the multiplier according to the sixth embodiment, an additional advantage that the I-V converter 13b can be simplified in configuration occurs.

SEVENTH EMBODIMENT

Figure 6A:
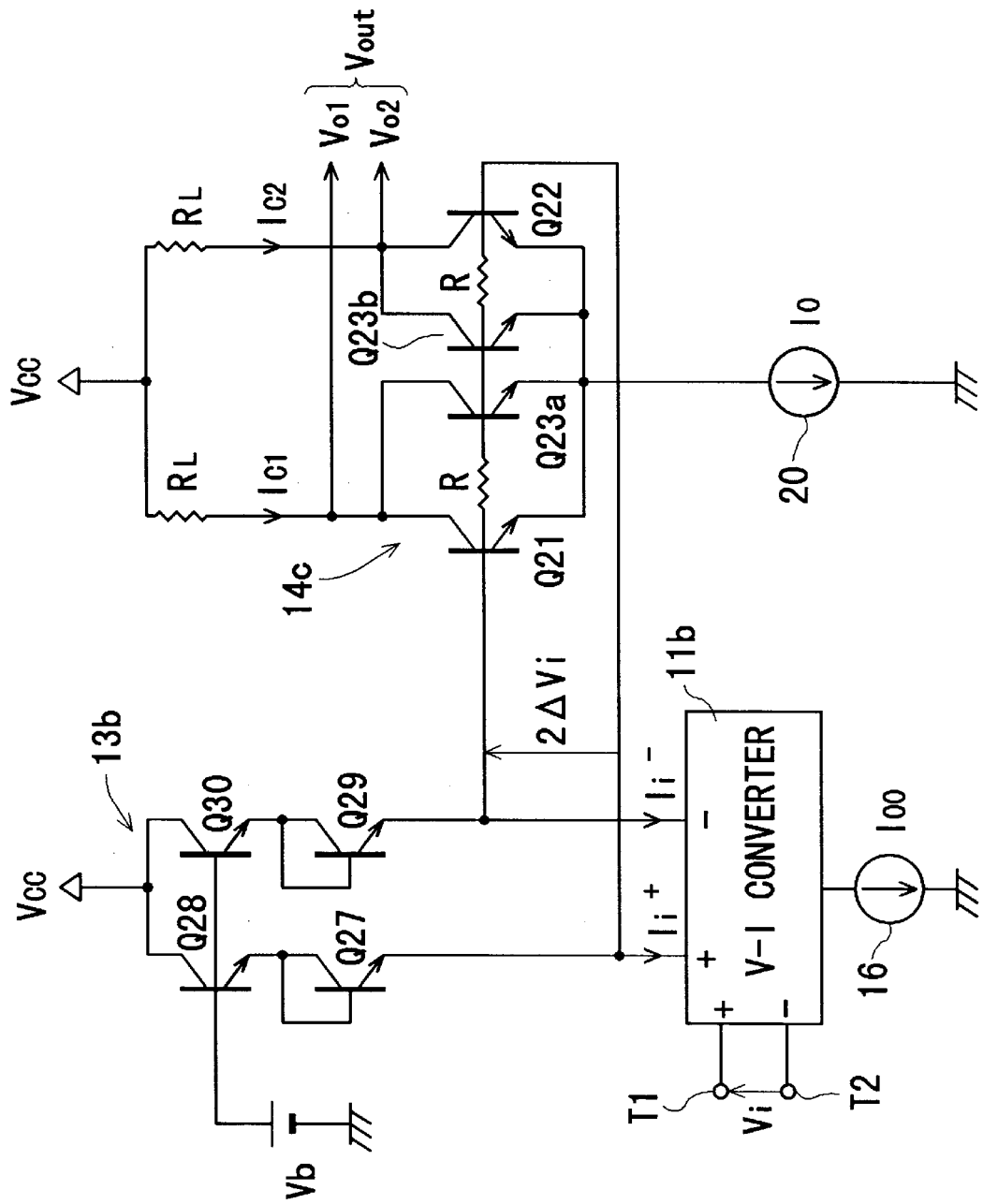
FIG. 6A is a circuit diagram of a differential circuit according to a seventh embodiment of the invention.

FIG. 6A shows a differential circuit according to a seventh embodiment of the present invention, which is the same configuration as that of the fifth embodiment except that the triple-tail cell 14c is used instead of the triple-tail cell 14b in the fifth embodiment.

In the differential circuit according to the seventh embodiment, an additional advantage that the I-V converter 13b can be simplified in configuration.

EIGHTH EMBODIMENT

Figure 6B:
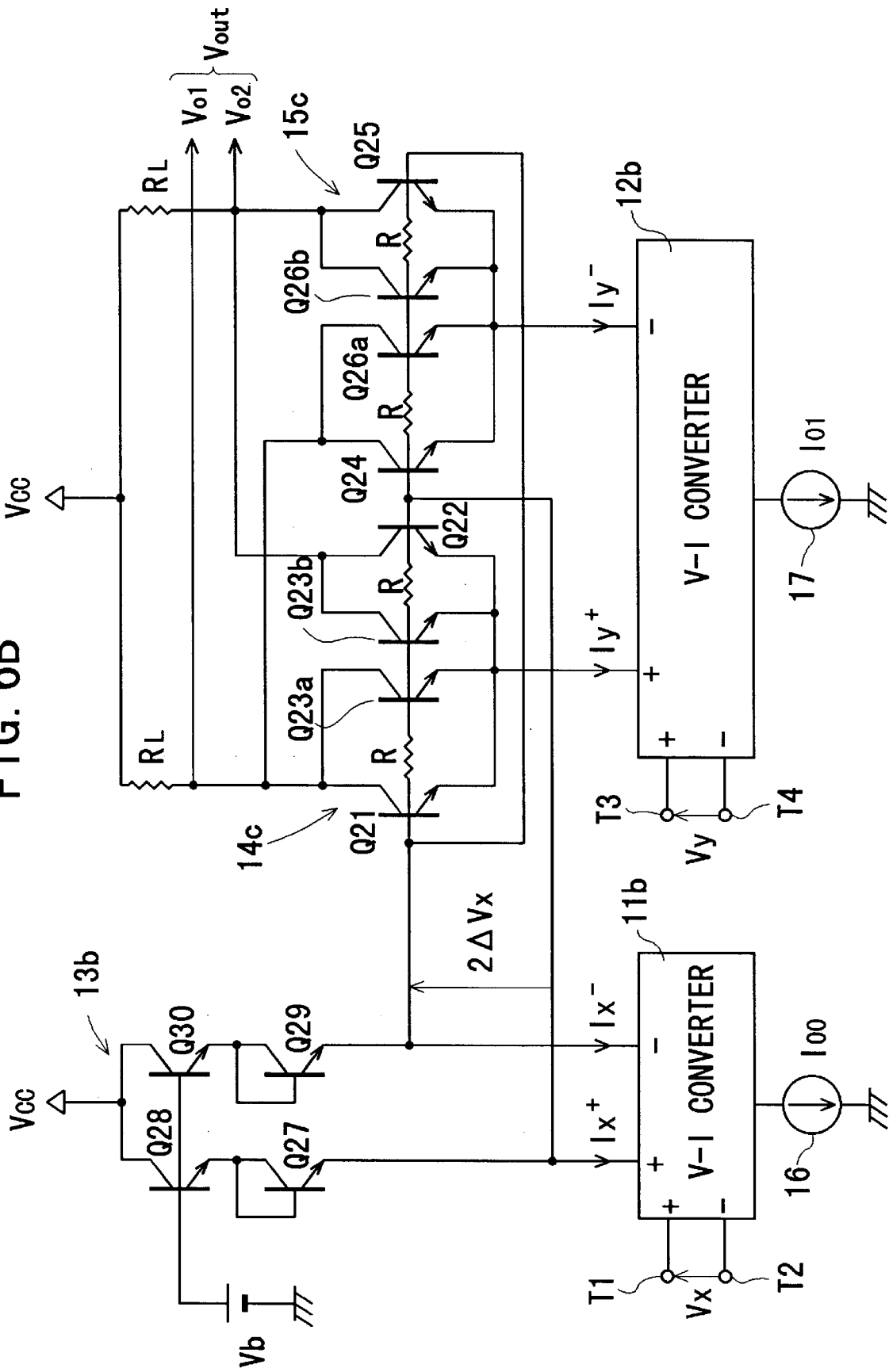
FIG. 6B is a circuit diagram of a multiplier according to an eighth embodiment of the invention, in which the differential circuit of FIG. 6A is used.

A multiplier according to an eighth embodiment of the present invention is shown in FIG. 6B, which is equivalent to a circuit obtained by adding a V-I converter 12b and a triple-tail cell 15c into the differential circuit according to the sixth embodiment of FIG. 6A.

In the multiplier according to the eighth embodiment, an additional advantage that the I-V converter 13b can be simplified in configuration.

NINTH EMBODIMENT

Figure 7A:
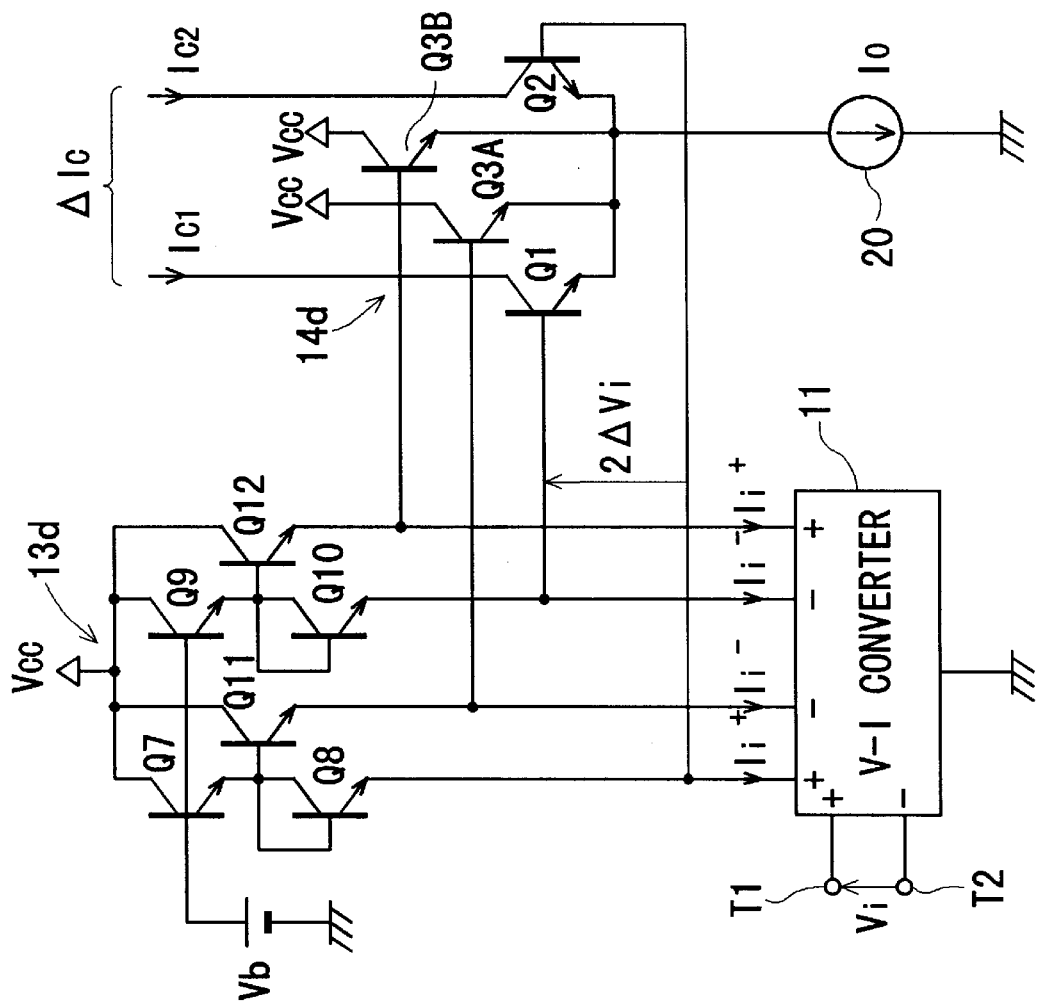
FIG. 7A is a circuit diagram of a differential circuit according to a ninth embodiment of the invention.

FIG. 7A shows a differential circuit according to a ninth embodiment of the present invention, which is the same configuration as that of the first embodiment except that a triple-tail cell 14d is used instead of the triple-tail cell 14 in the first embodiment and a I-V converter 13d is used instead of the I-V converter 13.

The triple-tail cell 14d has four npn bipolar transistors Q1, Q2, Q3A and Q3B whose emitters are coupled together, and is driven by the constant current $I_0$.

The emitter areas of the transistors Q1, Q2, Q3A and Q3B are the same.

The transistors Q1 and Q2 form a differential pair. A base of the transistor Q3A is applied with a bias voltage, and a base of the transistor Q3B is applied with another bias voltage. The transistors Q3A and Q3B serve as bypass transistors for the current $I_C$. Collectors of the transistors Q3A and Q3B are applied with the power supply voltage $V_{CC}$.

TENTH EMBODIMENT

Figure 7B:
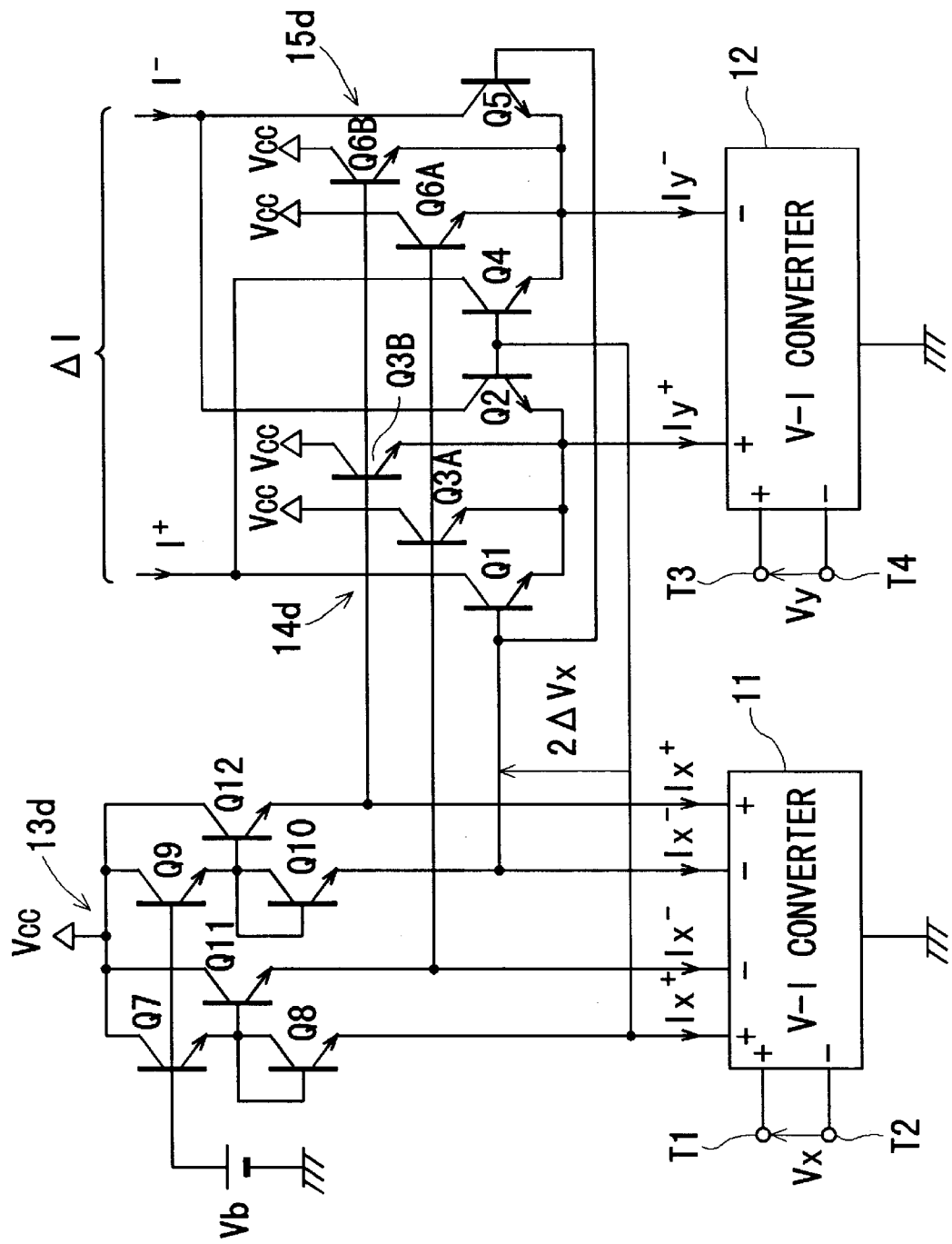
FIG. 7B is a circuit diagram of a multiplier according to a tenth embodiment of the invention, in which the differential circuit of FIG. 7A is used.

A multiplier according to a tenth embodiment of the present invention is shown in FIG. 7B, which is equivalent to a circuit obtained by adding a V-I converter 12 and a triple-tail cell 15d into the differential circuit according to the ninth embodiment of FIG. 7A.

ELEVENTH EMBODIMENT

FIG. 8A shows a differential circuit according to an eleventh embodiment of the present invention, which is the same configuration as that of the first embodiment except that a triple-tail cell 14e is used instead of the triple-tail cell 14 in the first embodiment and a I-V converter 13d is used instead of the converter 13.

The triple-tail cell 14e has four npn bipolar transistors Q1, Q2, Q3A and Q3B whose emitters are coupled together, and is driven by the constant current $I_0$.

The emitter areas of the transistors Q1, Q2, Q3A, and Q3B are the same.

The transistors Q1 and Q2 form a differential pair. A base of the transistor Q3A is applied with a bias voltage, and a base of the transistor Q3B is applied with another bias voltage. The transistors Q3A and Q3B serve as bypass transistors for the current $I_0$. Collectors of the transistors Q3A and Q3B are connected to the collectors of the transistors Q1 and Q2, respectively.

TWELFTH EMBODIMENT

Figure 8B:
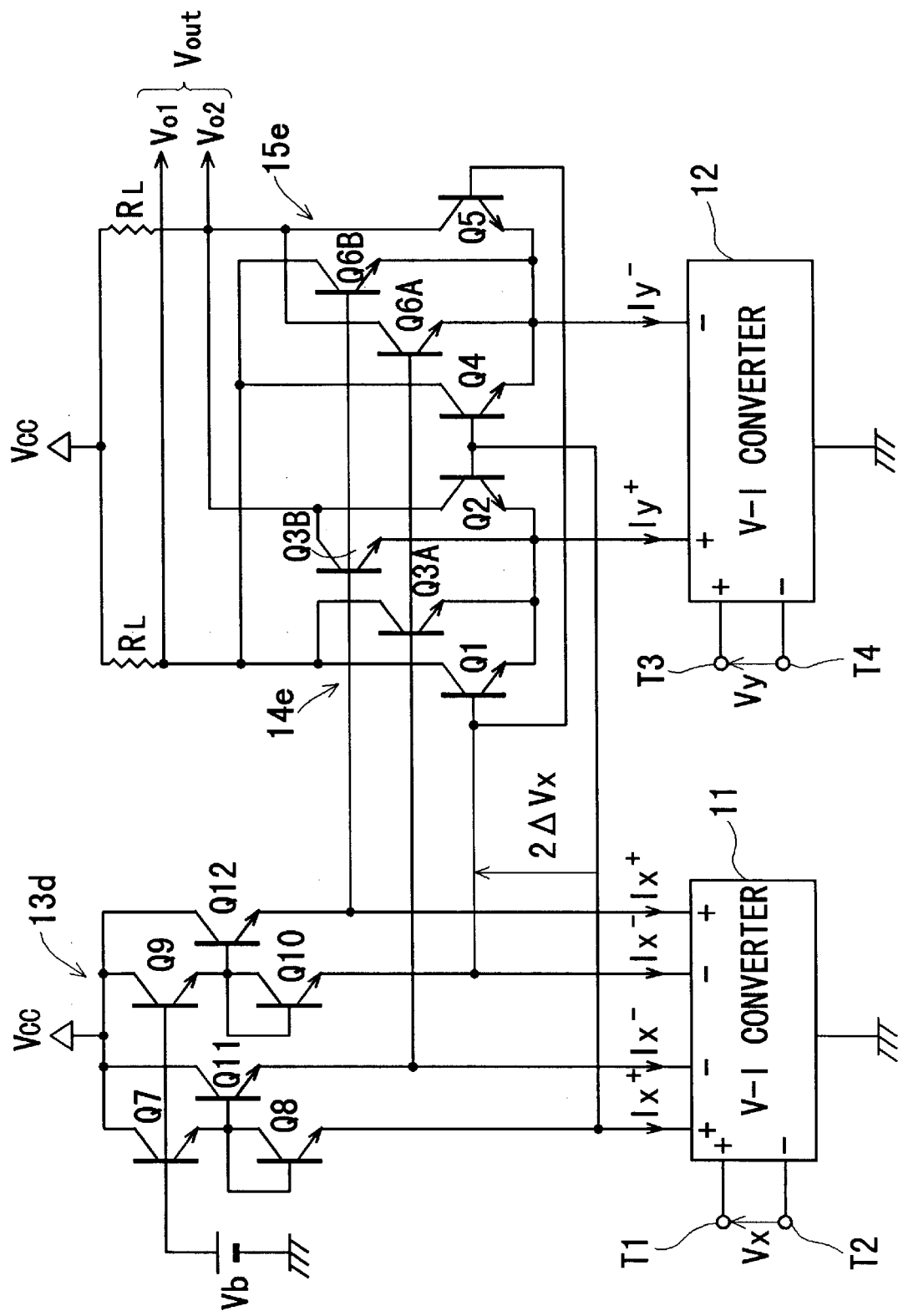
FIG. 8B is a circuit diagram of a multiplier according to a twelfth embodiment of the invention, in which the differential circuit of FIG. 8A is used.

A multiplier according to a twelfth embodiment of the present invention is shown in FIG. 8B, which is equivalent to a circuit obtained by adding a V-I converter 12 and a triple-tail cell 15e into the differential circuit according to the eleventh embodiment of FIG. 8A.

V-I CONVERTER

Figure 9:
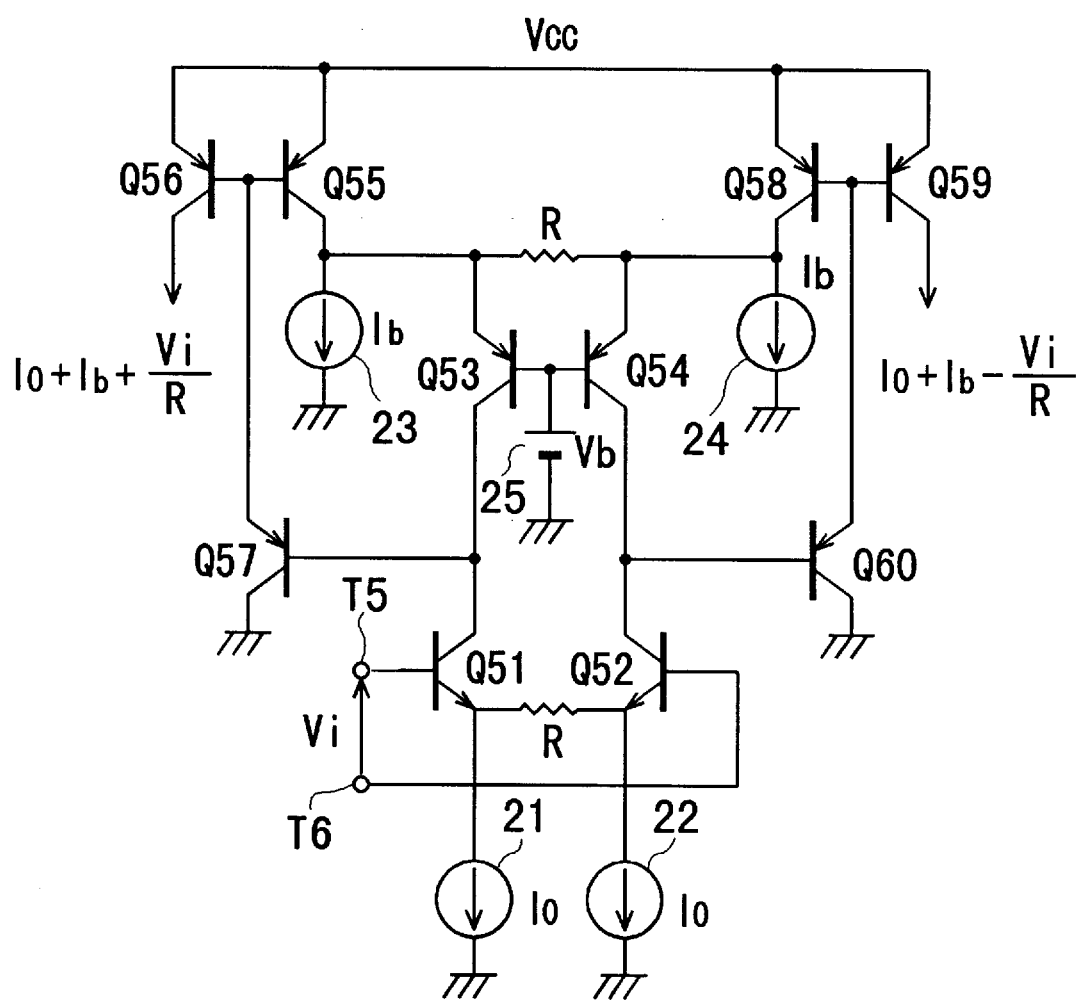
FIG. 9 is a circuit diagram of a V-I converter circuit, which is preferably used for the differential circuit and multiplier according to the invention.

FIG. 9 shows an example of the ideal V-I converters of this sort preferably used for the invention, which was created by the inventor, K. Kimura and was filed as a Japanese Patent Application No. 7-291955.

In FIG. 9, npn bipolar transistors Q51 and Q52 form a differential pair whose emitters are coupled together through an emitter resistor (resistance: R). An input voltage $V_i$ is differentially applied to bases of the transistors Q51 and Q52. One end of a constant current sink 21 (current: $I_0$) is connected to the emitter of the transistor Q51, and the other end is connected to the ground. One end of a constant current sink 22 (current: $I_0$) is connected to the emitter of the transistor Q52, and the other end is connected to the ground.

Pnp bipolar transistors Q53 and Q54 have emitters coupled together through an emitter resistor (resistance: R). Bases of the transistors Q53 and Q54 are coupled together to be connected to a positive terminal of a voltage source 25, thereby applying a constant bias voltage $V_b$ to the coupled bases of the transistors Q53 and Q54.

Pnp bipolar transistors Q55 and Q56 have emitters to be applied with a power supply voltage $V_{CC}$. Bases of the transistors Q55 and Q56 are coupled together to be connected to an emitter of a pnp bipolar transistor Q57. A collector of the transistor Q55 is connected to the emitter of the transistor Q53 and one end of a constant current sink 23 (current: $I_b$). The other end of the sink 23 is connected to the ground. The transistors Q55 and Q56 form a current mirror circuit.

Pnp bipolar transistors Q58 and Q59 have emitters to be applied with the power supply voltage $V_C$. Bases of the transistors Q58 and Q59 are coupled together to be connected to an emitter of a pnp bipolar transistor Q60. A collector of the transistor Q58 is connected to the emitter of the transistor Q54 and one end of a constant current sink 24 (current: $I_b$). The other end of the sink 24 is connected to the ground. The transistors Q58 and Q59 form a current mirror circuit.

A base of the transistor Q57 is connected to the collector of the transistor Q51. A base of the transistor Q60 is connected to the collector of the transistor Q52. Collectors of the transistors Q57 and Q60 are connected to the ground.

Supposing that the common-base current gain factor is approximately equal to unity and the base current can be ignored.

In the differential pair of the transistors Q51 and Q52, base-to-emitter voltages of the transistors Q51 and Q52 are defined as $V_{BE1}$ and $V_{BE2}$, respectively, and a current flowing through the resistor for the transistors Q51 and Q52 is defined as i, the following equation (16) is obtained.

$$V_i = V_{BE1} - V_{BE2} + Ri \quad (16)$$

From the above equation (16), the current i flowing through the emitter resistor is given by the following equation (17).

$$i = \frac{V_i - (V_{BE1} - V_{BE2})}{R} \quad (17)$$

The transistors Q53 and Q54 are opposite in polarity to the transistors Q51 and Q52. However, a common current flows through the transistors Q51 and Q53, and a common current flows through the transistors Q52 and Q54. As a result, the following equation (18) is established, $$V_{BE1} - V_{BE2} = V_{BE3} - V_{BE4} \quad (18)$$

where $V_{BE3}$ and $V_{BE4}$ are base-to-emitter voltages of the transistors Q53 and Q54.

A current path for the current flowing through the emitter resistor for the transistors Q53 and Q54 is formed by the constant current sinks 23 and 24.

When the current i flows through the emitter resistor for the transistors Q51 and Q52, the collector currents of the transistors Q51 and Q52 are expressed as $(I_0+i)$ and $(I_0-i)$, respectively.

If a current flowing through the emitter resistor for the transistors Q53 and Q54 is defined as i', the currents flowing through the input ends of the current mirror circuits are expressed as $(I_b+i'+I_0+i)$ and $(I_b-i'+I_0-i)$, respectively.

Here, the current i' can be expressed as $i'=(1/R)(V_{BE3}-V_{BE4})$. Therefore, $$i+i'=(1/R)[V_i-(V_{BE1}-V_{BE2})]+(1/R)(V_{BE3}-V_{BE4})=V_i/R$$

is established. As a result, $i+i'=(V_i/R)$.

The differential output current is defined as $2(i+i')$ and therefore, $2(i+i')=(2V_i/R)$ is established. This means that the differential output current is proportional to the input voltage $V_i$.

In the circuit of FIG. 9, the differential output current is emitted from the transistors Q56 and Q59. However, if the polarity of the transistors is changed and the relationship between the power supply voltage and the ground are replaced with each other, a V-I converter of the current sinking type may be used.

CONFIRMATION TEST

FIG. 10 shows the measured transfer characteristic of the multiplier according to the fourth embodiment of FIG. 4B, which was obtained under the condition that $V_{CC}=1.9$ V, and $R_L=8.2$ k$\Omega$, where $V_y=0$, ±200 mV, or ±400 mV. The converter shown in FIG. 9 was operated under the condition that $V_{CC}=3$ V, R=210 k$\Omega$, and $I_0 \approx 50$ $\mu$A.

It is seen from FIG. 10 that an ideal multiplication characteristic thus obtained allows to operate linearly within the input voltage range of approximately 1 V or less where the V-I converter shown in FIG. 9 is linearly operated.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A differential circuit comprising:
  (a) a voltage-current converter for converting an initial input voltage to generate first and second output currents, said first and second output currents having opposite polarities to each other and varying according to said initial input voltage, respectively;
  (b) a current-voltage converter for converting said first and second output currents to generate first and second output voltages;

(c) a triple-tail cell having first, second, and third transistors driven by a common constant current;

said first and second transistors forming a differential pair;

said first and second output voltages being differentially applied across input ends of said differential pair of said first and second transistors;

said third transistor serving as a bypass transistor for said common constant current;

an input end of said third transistor being applied with a bias voltage; and (d) an output current of said differential circuit being derived from output ends of said differential pair of said first and second transistors, wherein said first and second transistors have the same capability and said third transistor has a capability twice as much as those of said first and second transistors.

2. A differential circuit comprising:

(a) a voltage-current converter for converting an initial input voltage to generate first and second output currents, said first and second output currents having opposite polarities to each other and varying according to said initial input voltage, respectively;

(b) a current-voltage converter for converting said first and second output currents to generate first and second output voltages;

(c) a triple-tail cell having first, second, and third transistors driven by a common constant current;

said first and second transistors forming a differential pair;

said first and second output voltages being differentially applied across input ends of said differential pair of said first and second transistors;

said third transistor serving as a bypass transistor for said common constant current;

an input end of said third transistor being applied with a bias voltage; and (d) an output current of said differential circuit being derived from output ends of said differential pair of said first and second transistors, wherein said bias voltage of said third transistor is equal to one of said first and second output voltages.

3. A differential circuit comprising:

(a) a voltage-current converter for converting an initial input voltage to generate first and second output currents, said first and second output currents having opposite polarities to each other and varying according to said initial input voltage, respectively;

(b) a current-voltage converter for converting said first and second output currents to generate first and second output voltages;

(c) a triple-tail cell having first, second, third, and fourth transistors driven by a common constant current;

said first and second transistors forming a differential pair;

said first and second output voltages being differentially applied across input ends of said differential pair of said first and second transistors;

said third and fourth transistors serving as bypass transistors for said common constant current;

an input end of said third transistor being applied with a first bias voltage;

an input end of said fourth transistor being applied with a second bias voltage; and (d) an output current of said differential circuit being derived from at least one output end of said differential pair.

4. A differential circuit as claimed in claim 3, wherein said first, second, third, and fourth transistors have the same capability as each other.

5. A differential circuit as claimed in claim 3, wherein said first bias voltage of said third transistor and said second bias voltage of said fourth transistor are equal to one of said first and second output voltages, respectively.

6. A differential circuit as claimed in claim 3, further comprising first and second resistors;

wherein said first resistor is connected between one of said input ends of said differential pair and said input end of said third transistor;

and wherein said second resistor is connected between the other of said input ends of said differential pair and said input end of said fourth transistor.

7. A differential circuit as claimed in claim 3, wherein said first bias voltage of said third transistor is equal to said first output voltage, and said second bias voltage of said fourth transistor is equal to said second output voltage.

8. A differential circuit as claimed in claim 3, wherein output ends of said third and fourth transistors are connected to output ends of said differential pair, respectively.

9. A multiplier for multiplying first and second initial input voltages comprising:

(a) a first voltage-current converter for converting said first initial input voltage to generate first and second output currents, said first and second output currents having opposite polarities to each other and varying according to said first initial input voltage, respectively;

(b) a current-voltage converter for converting said first and second output currents to generate first and second output voltages;

(c) a second voltage-current converter for converting said second initial input voltage to generate third and fourth output currents, said third and fourth output currents having opposite polarities to each other and varying according to said second initial input voltage, respectively;

(d) a first triple-tail cell having first, second, and third transistors driven by said third output current;

said first and second transistors forming a first differential pair;

said first and second output voltages being differentially applied across input ends of said first differential pair of said first and second transistors;

said third transistor serving as a bypass transistor for said third output current;

an input end of said third transistor being applied with a first bias voltage;

(e) a second triple-tail cell having fourth, fifth, and sixth transistors driven by said fourth output current;

said fourth and fifth transistors forming a second differential pair;

said first and second output voltages being differentially applied across input ends of said second differential pair of said fourth and fifth transistors;

said sixth transistor serving as a bypass transistor for said fourth output current;

an input end of said sixth transistor being applied with a second bias voltage;

(f) output ends of said first and fourth transistors being coupled together, and output ends of said second and fifth transistors being coupled together; and (g) an output of said multiplier being derived from said coupled output ends of said first differential pair and those of said second differential pair.

10. A differential circuit as claimed in claim 9, wherein said first and second transistors have the same capability and said third transistor has a capability twice as much as those of said first and second transistors;

and wherein said fourth and fifth transistors have the same capability and said sixth transistor has a capability twice as much as those of said fourth and fifth transistors.

11. A differential circuit as claimed in claim 9, wherein said first and second bias voltages of said third and sixth transistors are equal to one of said first and second output voltages.

12. A differential circuit as claimed in claim 9, further comprising first, second, third, and fourth resistors;

wherein said first resistor is connected between one of said input ends of said first differential pair and said input end of said third transistor;

and wherein said second resistor is connected between the other of said input ends of said first differential pair and said input end of said third transistor;

wherein said third resistor is connected between one of said input ends of said second differential pair and said input end of said sixth transistor;

and wherein said fourth resistor is connected between the other of said input ends of said second differential pair and said input end of said third transistor.

13. A multiplier for multiplying first and second initial input voltages comprising:

(a) a first voltage-current converter for converting said first initial input voltage to generate first and second output currents, said first and second output currents having opposite polarities to each other and varying according to said first initial input voltage, respectively;

(b) a current-voltage converter for converting said first and second output currents to generate first and second output voltages;

(c) a second voltage-current converter for converting said second initial input voltage to generate third and fourth output currents, said third and fourth output currents having opposite polarities to each other and varying according to said second initial input voltage, respectively;

(d) a first triple-tail cell having first, second, third, and fourth transistors driven by said third output current;

said first and second transistors forming a first differential pair;

said first and second output voltages being differentially applied across input ends of differential pair of said first and second transistors;

said third and fourth transistors serving as bypass transistors for said third output current;

an input end of said third transistor being applied with a first bias voltage;

an input end of said fourth transistor being applied with a second bias voltage; and (e) a second triple-tail cell having fifth, sixth, seventh, and eighth transistors driven by said fourth output current;

said fifth and sixth transistors forming a second differential pair;

said first and second output voltages being differentially applied across input ends of said second differential pair of said sixth and fifth transistors;

said seventh and eighth transistors serving as bypass transistors for said fourth output current;

an input end of said seventh transistor being applied with a third bias voltage;

an input end of said eighth transistor being applied with a fourth bias voltage; and (f) output ends of said first and fifth transistors being coupled together, and output ends of said second and sixth transistors being coupled together; and (g) an output of said multiplier being derived from at least one of said coupled output ends of said first differential pair and those of said second differential pair.

14. A differential circuit as claimed in claim 13, wherein said first, second, third, and fourth transistors have the same capability as each other;

and wherein said fifth, sixth, seventh, and eighth transistors have the same capability as each other.

15. A differential circuit as claimed in claim 13, wherein said first, second, third, and fourth bias voltages of said third, fourth, seventh, and eighth transistors are equal to one of said first and second output voltages, respectively.

16. A differential circuit as claimed in claim 13, further comprising first, second, third, and fourth resistors;

wherein said first resistor is connected between one of said input ends of said first differential pair and said input end of said third transistor;

and wherein said second resistor is connected between the other of said input ends of said first differential pair and said input end of said fourth transistor;

wherein said third resistor is connected between one of said input ends of said second differential pair and said input end of said seventh transistor;

and wherein said fourth resistor is connected between the other of said input ends of said second differential pair and said input end of said eighth transistor.

17. A differential circuit as claimed in claim 13, wherein said first bias voltage of said third transistor is equal to said first output voltage, and said second bias voltage of said fourth transistor is equal to said second output voltage;

and wherein said third bias voltage of said seventh transistor is equal to said first output voltage, and said fourth bias voltage of said eighth transistor is equal to said second output voltage.

18. A differential circuit as claimed in claim 13, wherein output ends of said third and fourth transistors are connected to output ends of said first differential pair, respectively;

and wherein output ends of said seventh and eighth transistors are connected to output ends of said second differential pair, respectively.

* * * * *

UNITED STATES PATENT AND TRADEMARK OFFICE
CERTIFICATE OF CORRECTION

PATENT NO. : 5,883,539
DATED : March 16, 1999
INVENTOR(S) : Katsuji KIMURA

It is certified that error appears in the above-indentified patent and that said Letters Patent is hereby corrected as shown below:

Column 2, line 41, delete "if lows" and insert --i flows--;

Column 2, line 45, delete "C$_o$" and insert --V$_e$--;

Column 2, line 48, delete "$\Delta UI_c$" and insert --$\Delta I_c$--.

Column 8, line 10, delete "Li$_i$" and insert --I$_i$--.

Column 15, line 43, delete "V$_c$" and insert --V$_{cc}$--.

Column 16, formula 17, delete "$i = \dfrac{V_i - (V_{BE1} - V_{BE2})}{R}$"

and insert --$i = \dfrac{V_I - (V_{BE1} - V_{BE2})}{R}$--.

Signed and Sealed this

Ninth Day of November, 1999

Q. TODD DICKINSON

Attest:

Attesting Officer

Acting Commissioner of Patents and Trademarks